US009331088B2

(12) United States Patent
Takaki

(10) Patent No.: US 9,331,088 B2
(45) Date of Patent: May 3, 2016

(54) TRANSISTOR DEVICE WITH GATE BOTTOM ISOLATION AND METHOD OF MAKING THEREOF

(71) Applicant: SanDisk 3D LLC, Milpitas, CA (US)

(72) Inventor: Seje Takaki, Yokkaichi (JP)

(73) Assignee: SANDISK 3D LLC, Milpitas, CA (US)

( * ) Notice: Subject to any disclaimer, the term of this patent is extended or adjusted under 35 U.S.C. 154(b) by 12 days.

(21) Appl. No.: 14/224,290

(22) Filed: Mar. 25, 2014

(65) Prior Publication Data
US 2015/0279850 A1 Oct. 1, 2015

(51) Int. Cl.
| | |
|---|---|
| *H01L 27/115* | (2006.01) |
| *H01L 29/66* | (2006.01) |
| *G11C 13/00* | (2006.01) |
| *H01L 27/10* | (2006.01) |
| *H01L 27/24* | (2006.01) |
| *H01L 45/00* | (2006.01) |

(52) U.S. Cl.
CPC ...... *H01L 27/11524* (2013.01); *G11C 13/0002* (2013.01); *H01L 27/101* (2013.01); *H01L 27/11556* (2013.01); *H01L 27/249* (2013.01); *H01L 27/2454* (2013.01); *H01L 29/66825* (2013.01); *H01L 45/04* (2013.01); *H01L 45/1226* (2013.01); *H01L 45/16* (2013.01)

(58) Field of Classification Search
USPC .......................................................... 257/369
See application file for complete search history.

(56) References Cited

U.S. PATENT DOCUMENTS

| | | | |
|---|---|---|---|
| 5,915,167 | A | 6/1999 | Leedy |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |

(Continued)

FOREIGN PATENT DOCUMENTS

| | | |
|---|---|---|
| KR | 20100109745 A | 10/2010 |
| KR | 20110021444 A | 3/2011 |
| WO | WO02/15277 A2 | 2/2002 |

OTHER PUBLICATIONS

International search report and written opinion received in connection with international application No. PCT/US2015/021720: mailed Jun. 10, 2015.

(Continued)

*Primary Examiner* — Jarrett Stark
*Assistant Examiner* — Charles N Ausar-El
(74) *Attorney, Agent, or Firm* — The Marbury Law Group PLLC

(57) ABSTRACT

An embodiment relates to a transistor device including a pillar of semiconductor material extending vertically from a bottom portion in contact with an electrically conductive contact line, where the electrically conductive contact line extends laterally past the pillar in a horizontal direction, a gate insulating liner layer on a lateral side of the pillar, a gate electrode on the gate insulating layer extending along the lateral side of the pillar, and a region of electrically insulating semiconductor oxide material filling a space between a bottom portion of the gate electrode and a top portion of the electrically conductive contact line.

48 Claims, 21 Drawing Sheets

(56) References Cited

U.S. PATENT DOCUMENTS

| | | |
|---|---|---|
| 7,846,782 B2 | 12/2010 | Maxwell et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,932 B2 | 5/2012 | Nguyen et al. |
| 8,394,716 B2 | 3/2013 | Hwang et al. |
| 8,520,425 B2 | 8/2013 | Xiao et al. |
| 9,165,933 B2 * | 10/2015 | Rabkin ............... H01L 27/249 |
| 2003/0062574 A1 | 4/2003 | Hsieh |
| 2007/0210338 A1 | 9/2007 | Orlowski |
| 2007/0252201 A1 | 11/2007 | Kito et al. |
| 2009/0230449 A1 | 9/2009 | Sakaguchi et al. |
| 2010/0013049 A1 | 1/2010 | Tanaka et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0254191 A1 | 10/2010 | Son et al. |
| 2010/0320528 A1 | 12/2010 | Jeong et al. |
| 2011/0031546 A1 | 2/2011 | Uenaka et al. |
| 2011/0076819 A1 | 3/2011 | Kim et al. |
| 2011/0133606 A1 | 6/2011 | Yoshida et al. |
| 2011/0169071 A1 | 7/2011 | Uenaka |
| 2011/0193042 A1 * | 8/2011 | Maxwell ............... 257/1 |
| 2011/0266606 A1 | 11/2011 | Park et al. |
| 2011/0303985 A1 * | 12/2011 | Masuoka ............... H01L 21/84 257/369 |
| 2012/0001144 A1 * | 1/2012 | Greeley et al. ............... 257/4 |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0147644 A1 | 6/2012 | Scheuerlein |
| 2012/0147648 A1 | 6/2012 | Scheuerlein |
| 2012/0161094 A1 | 6/2012 | Huo et al. |
| 2012/0205713 A1 | 8/2012 | Tang |
| 2013/0026562 A1 | 1/2013 | Beigel et al. |
| 2013/0148400 A1 | 6/2013 | Murooka |
| 2013/0248974 A1 | 9/2013 | Alsmeier et al. |
| 2013/0264631 A1 | 10/2013 | Alsmeier et al. |
| 2013/0292630 A1 | 11/2013 | Sasago et al. |
| 2013/0313627 A1 | 11/2013 | Lee |

OTHER PUBLICATIONS

U.S. Appl. No. 14/136,103, filed Dec. 20, 2013, Takaki.
U.S. Appl. No. 14/206,196, filed Mar. 12, 2014, Takaki.
U.S. Appl. No. 14/150,162, filed Jan. 8, 2014, Takaki et al.
Invitation to Pay Additional Search Fees issued in PCT Application No. PCT/US13/41410, mailed Sep. 9, 2013.(6 pp.).
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T.et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.

* cited by examiner

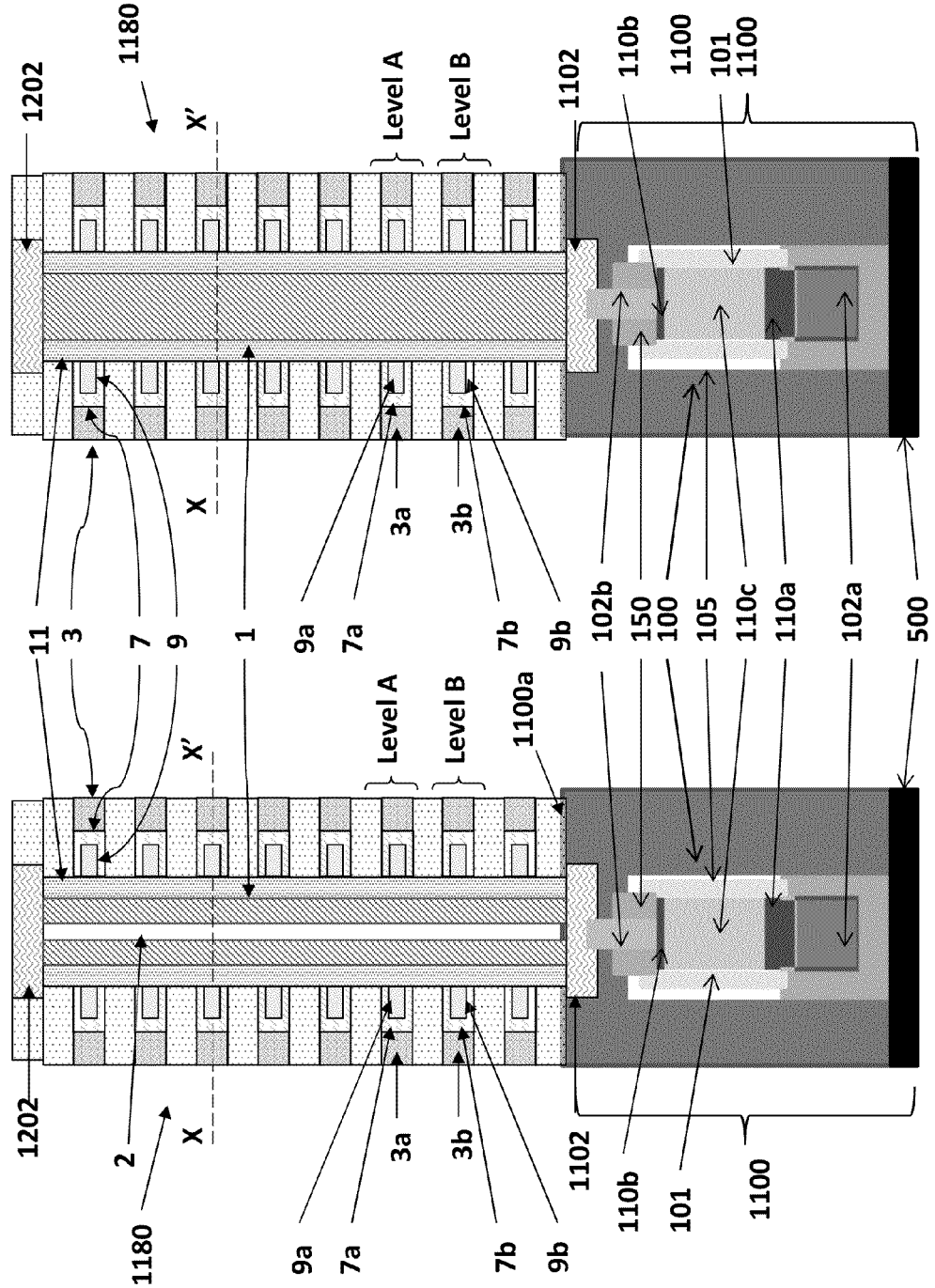

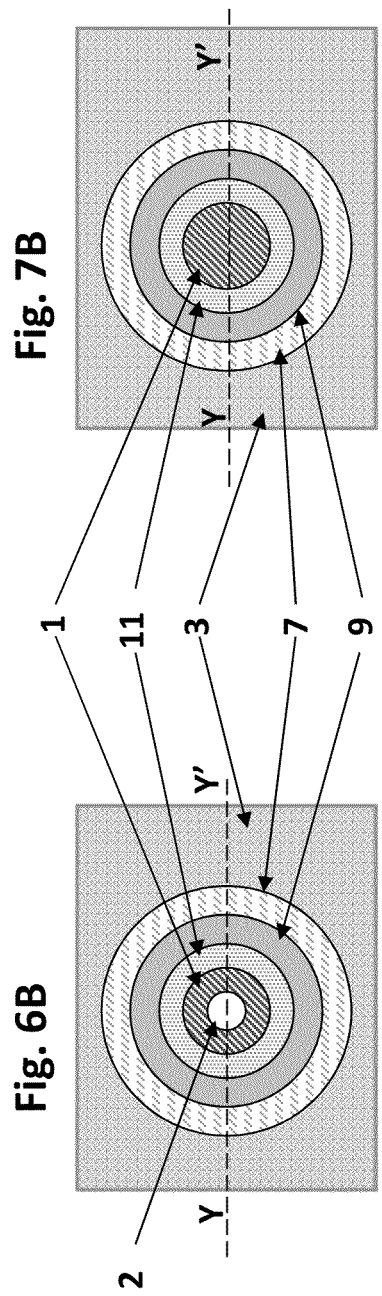

TRANSISTOR DEVICE WITH GATE BOTTOM ISOLATION AND METHOD OF MAKING THEREOF

FIELD

The present invention relates generally to the field of semiconductor devices and specifically to vertical restive random access memory (ReRAM) devices other three dimensional devices and methods of making thereof.

BACKGROUND

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. An example of an array of variable resistive elements and associated diodes is given in U.S. Patent Application Publication No. US 2009/0001344.

SUMMARY

One embodiment relates to a method of making one or more transistors in a device. The method includes: a) providing a base comprising a plurality of electrically conductive contact lines horizontally alternating with a plurality of electrically insulating lines, wherein the plurality of electrically insulating lines insulate each of the plurality of electrically conductive contact lines from the others of the plurality of electrically conductive contact lines; b) forming recesses in a top surface of the plurality of electrically conductive contact lines; c) forming a layer stack comprising at least one layer of semiconductor material on a top surface of the base, wherein the semiconductor material extends into and fills the recesses; d) patterning the layer stack to expose the plurality of electrically insulating lines and form a horizontally extending first plurality of trenches in the layer stack overlaying the exposed plurality of electrically insulating lines; e) filling the first plurality of trenches with an electrically insulating fill material; f) patterning the layer stack and the electrically insulating fill material to form a second plurality of trenches extending horizontally in a direction transverse to the first plurality of trenches, wherein the bottom of each the second plurality of trenches comprises horizontally alternating exposed regions of the plurality of upper insulating layers and the plurality of the semiconductor material filing the one or more recesses; and g) oxidizing the one or more regions of the semiconductor material filing the one or more recesses to form one or more insulating oxide regions.

Another embodiment relates to a transistor device including: a pillar of semiconductor material extending vertically from a bottom portion in contact with an electrically conductive contact line, wherein the electrically conductive contact line extends laterally past the pillar in a horizontal direction; a gate insulating liner layer on a lateral side of the pillar; a gate electrode on the gate insulating layer extending along the lateral side of the pillar; and a region of electrically insulating semiconductor oxide material filling a space between a bottom portion of the gate electrode and a top portion of the electrically conductive contact line.

Another embodiment relates to a device including a plurality of transistors. In some embodiments, the device includes: a base comprising a plurality of electrically conductive contact lines horizontally alternating with a plurality of electrically insulating lines. In some embodiments, the plurality of electrically insulating lines insulate each of the plurality of electrically conductive contact lines from the others of the plurality of electrically conductive contact lines. In some embodiments, each of the plurality of electrically insulating lines comprises an upper layer of a first electrically insulating material overlaying a lower layer of a second electrically insulating material. In some embodiments, the base has a top surface comprising respective recesses overlaying and extending in a first horizontal direction along each of the plurality of the electrically conductive contact lines.

The device may also include a first plurality of pillars of semiconductor material, each pillar extending vertically from a bottom portion in contact with a respective one of the plurality of electrically conductive contact lines and further extending through one of the plurality of recesses overlaying a respective one of the plurality of electrically conductive contact lines to a top portion located vertically above the top surface of the base, where a portion of the respective electrically conductive contact line and the respective overlaying recess extend from a lateral side of the pillar along the first horizontal direction. The device may also include one or more gate electrodes extending along lateral sides of each of the plurality of pillars and electrically insulted from the pillars by a gate insulating layer. The device may also include a semiconductor oxide material filling at least portions of the recesses extending laterally from the lateral side of each of the plurality of pillars to form gate bottom insulation regions filing spaces between bottom portions of the one or more gate electrodes and the top portions of the plurality of electrically conductive contact lines.

BRIEF DESCRIPTION OF THE DRAWINGS

FIGS. 6A-6B are respectively side cross sectional and top cross sectional views of a NAND string of one embodiment. FIG. 6A is a side cross sectional view of the device along line Y-Y' in FIG. 6B, while FIG. 6B is a side cross sectional view of the device along line X-X' in FIG. 6A.

FIG. 7A-7B are respectively side cross sectional and top cross sectional views of a NAND string of another embodiment. FIG. 7A is a side cross sectional view of the device along line Y-Y' in FIG. 7B, while FIG. 7B is a side cross sectional view of the device along line X-X' in FIG. 7A.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the invention provide a monolithic, three dimensional array of memory devices, such as an array of ReRAM devices or vertical NAND strings. The memory cells of such devices may be vertically oriented, such that at least one memory cell is located over another memory cell. The array allows vertical scaling of the devices to provide a higher density of memory cells per unit area of silicon or other semiconductor material.

Figure 1:
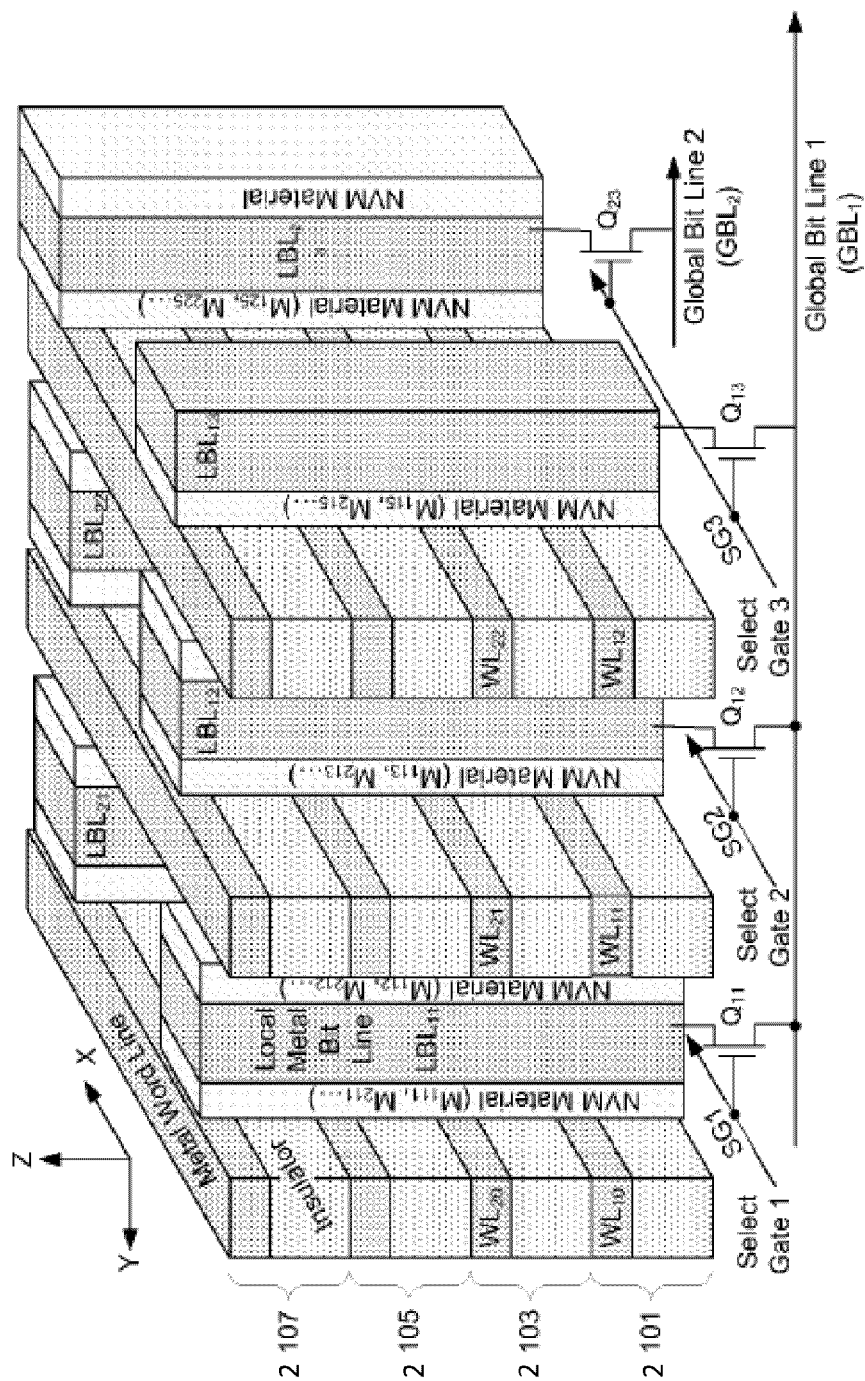
FIG. 1 shows a perspective view of a three dimensional ReRAM memory device.

FIG. 1 shows one example semiconductor structure for implementing a vertically oriented 3D ReRAM memory element, of the type described in U.S. Pat. Pub. No. 2012/0147648, published Jun. 14, 2012 and incorporated by reference herein in its entirety. The ReRAM device is configured for use of non-volatile memory element ("NVM") material that is non-conductive when first deposited. Since the material is initially non-conductive, there is no necessity to isolate the memory elements at the cross-points of the word and bit lines from each other. Several memory elements may be implemented by a single continuous layer of material, which in the case of FIG. 1 are strips of NVM material oriented vertically along opposite sides of the vertical bit lines in the y-direction and extending upwards through all the planes in the z-direction. A significant advantage of the structure of FIG. 1 is that all word lines and strips of insulation under them in a group of planes may be defined simultaneously by use of a single mask, thus greatly simplifying the manufacturing process.

Referring to FIG. 1, a small part of four planes (e.g., drive levels separated in the z-direction) 2101, 2103, 2105 and 2107 of the three-dimensional array are shown. All of the planes have the same horizontal pattern of conductive, insulating and NVM materials. In each plane, electrically conductive (e.g., metal) word lines ($WL_{zy}$) are elongated in the x-direction and spaced apart in the y-direction. Each plane includes a layer of insulating material (e.g., a dielectric) that isolates its word lines from the word lines of the plane below it or, in the case of plane 101, of the substrate circuit components below it. In some embodiments, the word lines $WL_{zy}$ for a fixed value of y form a stack of alternating layers that may extend beyond the memory device into a contact area (not shown).

Extending through each plane is a collection of electrically conductive (e.g., metal) local bit line (LBL) "pillars" elongated in the vertical z-direction and forming a regular array in the x-y planes.

Each bit line pillar is connected to one of a set of underlying global bit lines (GBL) (e.g., located in the silicon substrate) running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be transistors of the type described in detail herein, e.g., as shown in FIGS. 2A-3C. Also fabricated in the substrate but not shown in FIG. 1 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide (e.g., nickel oxide or copper oxide) for the memory storage element material, a small region of the NVM material between an intersecting local bit line (LBL) and word line (WL) is controllably alternated between more conductive (set) and less conductive (reset) states by appropriate voltages applied to the intersecting lines.

Figure 2A:
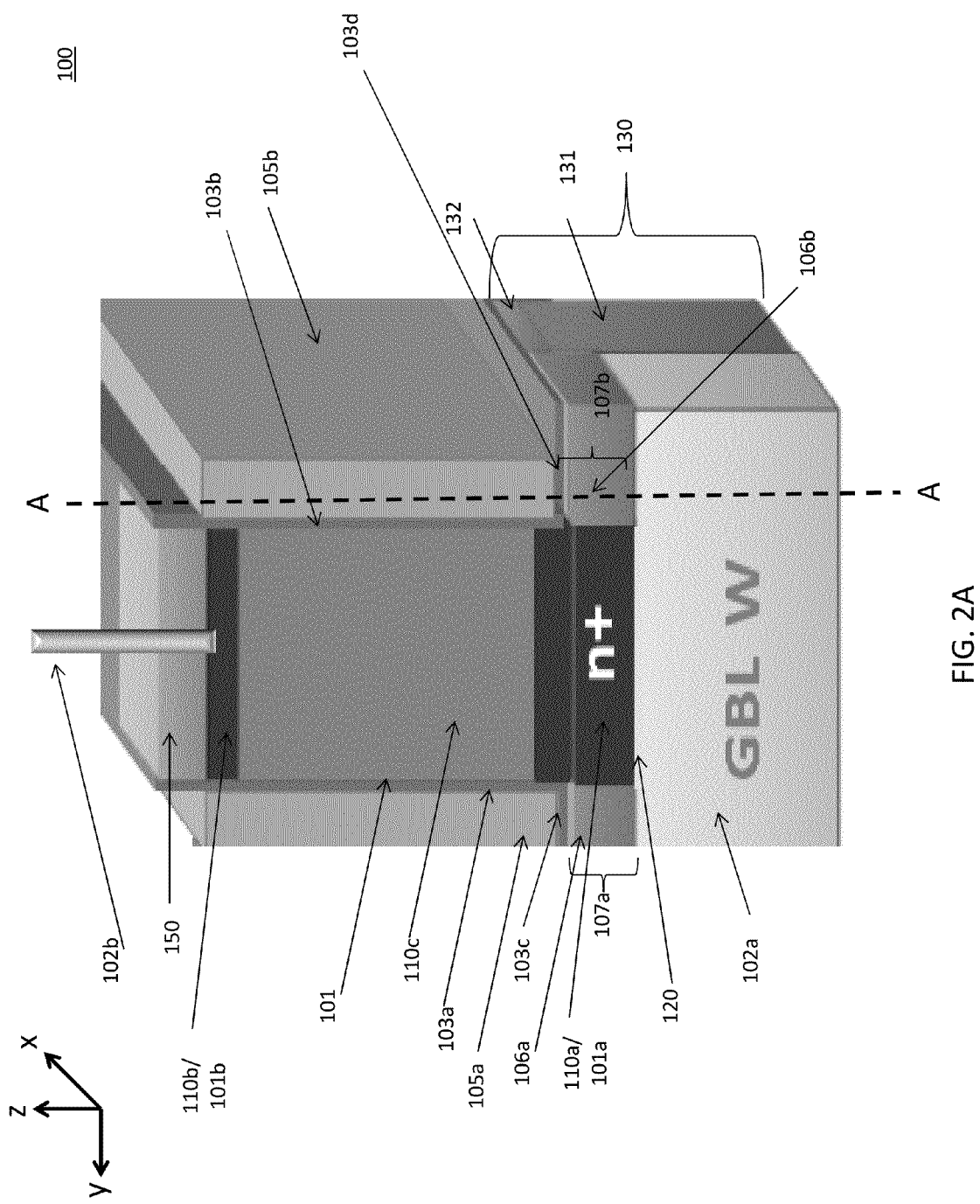
FIG. 2A shows a perspective view of a transistor.
Figure 2B:
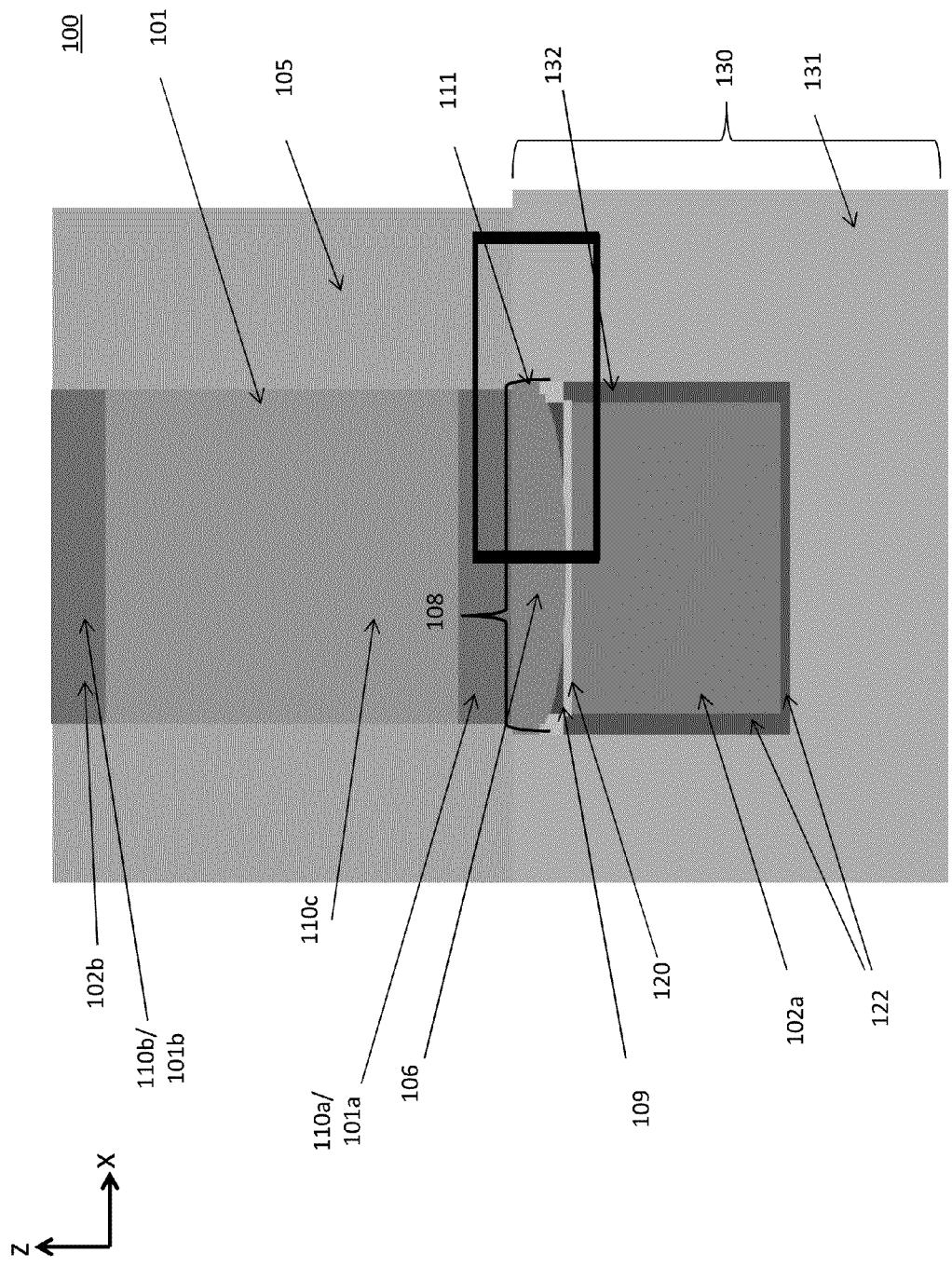
FIG. 2B shows a side cross section view of the transistor of FIG. 2A in the plane parallel to the x-direction through the line A-A in FIG. 2A.
Figure 2C:
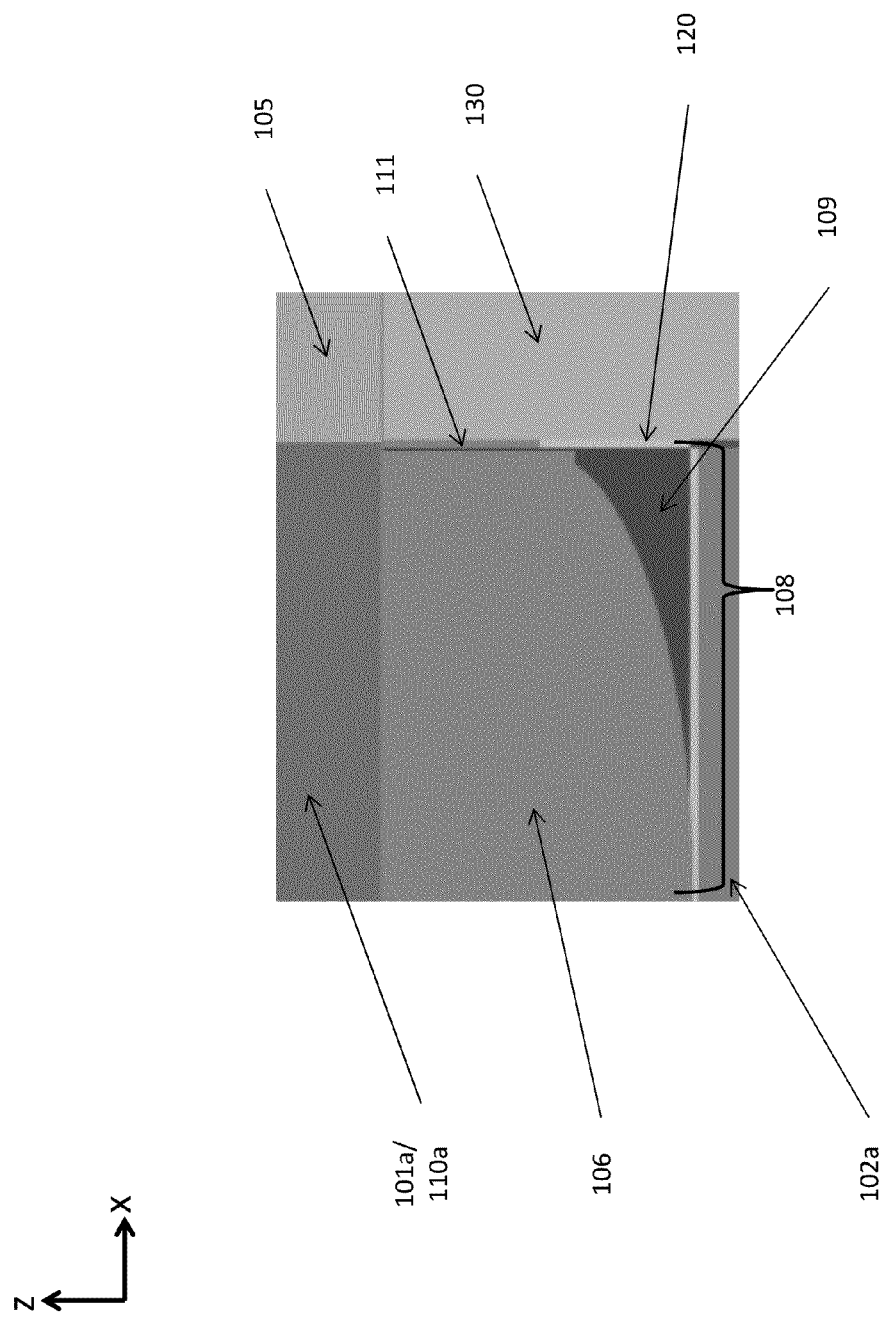
FIG. 2C shows detailed view of the inset region of FIGS. 2B and 3B indicated by a bold box in FIGS. 2B and 3B.

Referring to FIGS. 2A-2C, in some embodiments, the select devices (Q) may each be formed as vertically oriented transistor 100 (e.g., field effect transistors). In some embodiments, the transistor 100 may include a pillar 101 of semiconductor material extending vertically (as shown in FIGS. 2A-2C, the z-direction) from a bottom portion 101a in contact with a first electrically conductive contact line 102a, such as a global bit line. The electrically conductive contact line 102a extends laterally past the pillar in a horizontal direction (as shown in FIG. 2A, the y-direction).

In some embodiments, the electrically conductive contact line 102a may include a metal, such as W, Mo, Cr or a noble metal, a metal nitride, such a WN, TiN, or a metal silicide. In some embodiments, the electrically conductive contact line 102a may include a metal silicide contact portion (not shown) disposed between a metal portion and the bottom portion 101a of the pillar 101.

In some embodiments, the electrically conductive contact line 102a may be located in a trench formed between lines of electrically insulating material 130 (e.g., a dielectric material comprising a silicon oxide 131 having an optional top layer of silicon nitride 132).

Optionally, a barrier metal layer 120 may be formed between the bottom portion 101a of the pillar 101 and the electrically conductive contact line 102a. In some embodiments, the barrier metal layer 120 may be a thin layer of metal, metal nitride (e.g., WN, TiN) or other suitable material that inhibits diffusion of materials and/or compound formation between the electrically conductive contact line 102a and the bottom portion 101a of the pillar 101, e.g., during annealing or other thermal processes performed during fabrication of the transistor 100.

A first gate insulating liner layer 103a is located on a first lateral side of the pillar 101 (e.g., the left side of the pillar 101, as shown in FIGS. 2A-C). A first gate electrode 105a is located on the first gate insulating liner layer 103a, and extends along the first lateral side of the pillar 101 (e.g., in the x-direction, as shown in FIG. 2A). In some embodiments a second gate insulating liner layer 103b and a second gate electrode 105b may be located on another side of the pillar 101, (e.g., the right side of the pillar 101, as shown in FIGS. 2A-C).

In some embodiments, the first and/or second gate electrodes 105 may comprise or be in electrical contact with the one of the select gate lines (SG) of the ReRAM device shown in FIG. 1. In some embodiments, bottom gate insulating liner layers 103c/103d may be formed below the gate electrodes 105a/105b.

In various embodiments the gate insulating liner layers 103 may be made of any suitable insulating material, such as an oxide material (e.g., silicon oxide) or a nitride material (e.g., silicon nitride).

In some embodiments, the gate electrodes 105 may be made of, e.g., a doped semiconductor material (e.g., doped polycrystalline silicon) or other electrically conductive materials (e.g., a metal, metal silicide, metal nitride, or combinations thereof).

A region of electrically insulating semiconductor oxide material 106a (e.g., a silicon oxide) may fill (e.g., partially, substantially, or completely fill) a space 107a between a bottom portion of the gate electrode 105a (on the left side of the pillar 101) and a top portion of the electrically conductive contact line 102a. Another region of electrically insulating semiconductor oxide material 106b may fill a space 107b between a bottom portion of the gate electrode 105b (on the right side of the pillar 101) and a top portion of the electrically conductive contact line 102a. In some embodiments, portions of the bottom gate insulating layers 103c/103b may be sandwiched between the bottom of the gate electrodes 105a/105b and the tops of the regions of semiconductor oxide material 106a/106b filling the spaces 107a/107b.

In some embodiments, the electrically insulating semiconductor oxide material 106 can advantageously reduce or eliminate current leakage between the gate electrodes 105 and the electrically conductive contact line 102a.

Referring to FIGS. 2B and 2C, in some embodiments, the region of electrically insulating semiconductor oxide material 106 substantially fills a recess 108 (defining the spaces 107 shown in FIG. 2A) above the electrically conductive contact line 102a. Corners of the recess 108 may include an unoxidized semiconductor material residue 109 disposed below the region of electrically insulating semiconductor oxide material. For example, in some embodiments, the region of electrically insulating semiconductor oxide material 106 comprises an oxidized portion 109 of semiconductor material extending horizontally (e.g., in the y-direction into and out of the page as shown in FIGS. 2B and 2C) from the bottom portion 101a of the pillar 101 (shown as ghost image in FIGS. 2B and 2C to indicate that the pillar 101 lies outside the plane of the cross section through line AA in FIG. 2A).

Additionally or alternatively, corners of the recess 108 may include oxidized metal material residue 111 from oxidized portions of the optional barrier metal layer 120 disposed between the pillar of semiconductor material 101 and the electrically conductive contact line 102a. The metal material residue 111 may include, e.g., a metal oxide or a metal oxynitride.

In some embodiments, the unoxidized semiconductor material residue 109 and/or the oxidized metal material residue 111 from the optional barrier metal layer 120 result from a fabrication process of the type described below with reference to FIGS. 4A-4I. An insulating or conductive liner 122 may be located adjacent to side or bottom surfaces of each contact line, as shown in FIG. 2B.

In some embodiments, the pillar 101 comprises a channel 110c of the transistor device 100 and the electrically conductive contact line 102a comprises one of a source or a drain contact line of the transistor. The electrically conductive contact line 102a may be connected to or integrated with other devices. For example, the electrically conductive contact line 102a may comprise or be in electrical contact with one of the global bit lines (GBL) shown in FIG. 1.

Some embodiments include a second electrically conductive contact line 102b that comprises the other one of a source or a drain contact line of the transistor 100, as shown in FIG. 2A. The second electrically conductive contact line 102b may be in electrical contact with a top portion 101b of the pillar 101. In some embodiments, the conductive contact line 102b may extend through an insulating layer 150 (e.g., an oxide or nitride layer) formed over a top surface of the top portion 101b of the pillar 101. For example, in some embodiments a portion of the contact line 102b may fill a via hole extending through the insulating layer 150.

The electrically conductive contact line 102b may also be connected to or integrated with other devices. In some embodiments, the second electrically conductive contact line 102b may comprise or make electrical contact with the one of the local bit lines (LBL) of the ReRAM device shown in FIG. 1.

In some embodiments, the pillar 101 comprises a channel layer 110c of a first conductivity type semiconductor material sandwiched between a source or drain layer 110b of a second conductivity type semiconductor material (e.g., corresponding to the upper portion 101b of the pillar 101) and a drain or source layer 110a of the second conductivity type semiconductor material (e.g., corresponding to the lower portion 101a of the pillar 101).

In the example shown in FIGS. 2A-2C, the first conductivity type is p-type and the second conductivity type is n-type. In other embodiments, the first conductivity type is n-type and the second conductivity type is p-type. In some embodiments, the semiconductor material of pillar 101 comprises polycrystalline semiconductor material such as polycrystalline silicon. However, in other embodiments other types of suitable semiconductor material may be used, e.g., amorphous or microcrystalline silicon, compound semiconductors (e.g., cadmium selenide or gallium arsenide), etc.

Figure 3A:
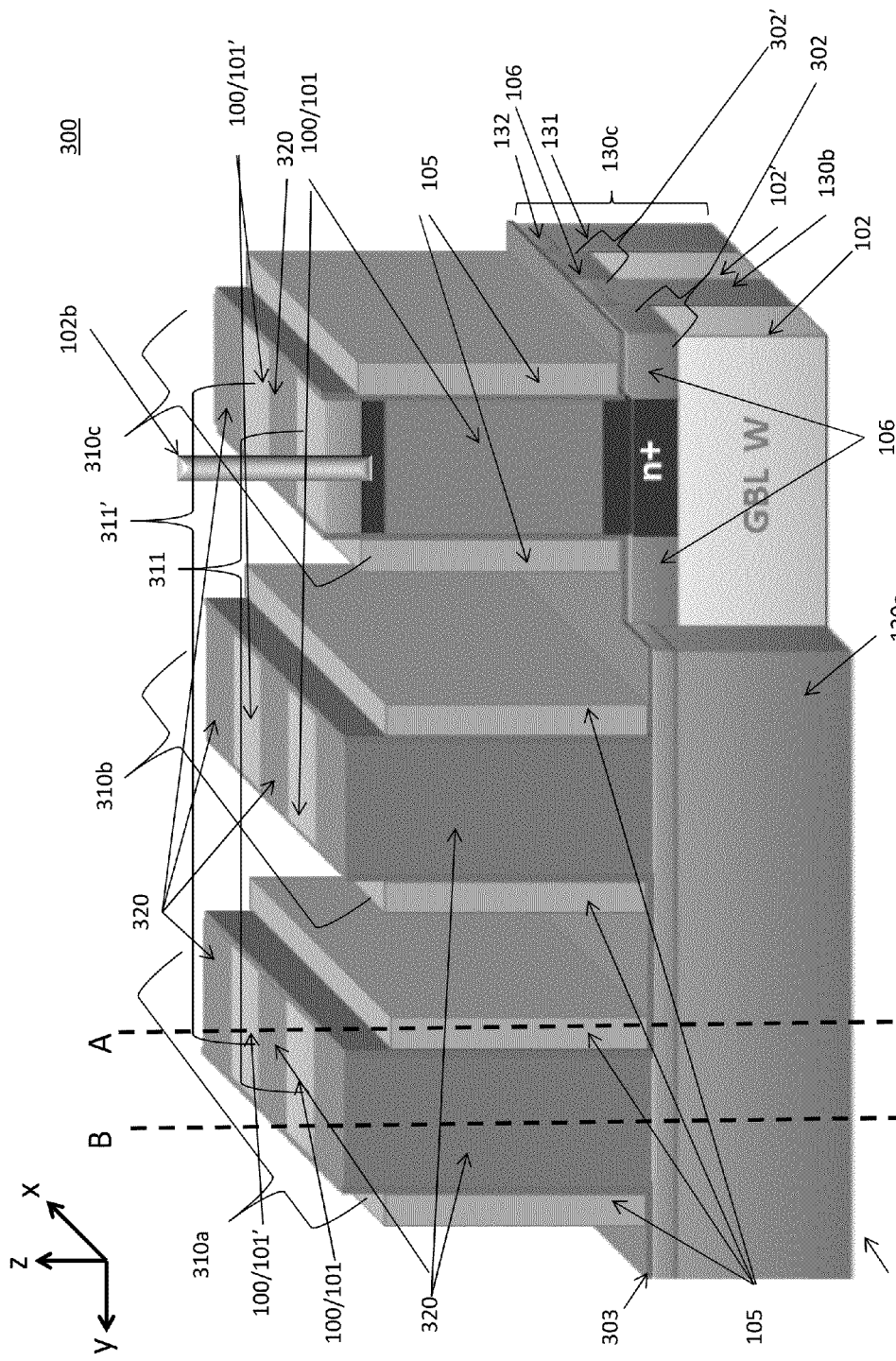
FIG. 3A shows a perspective view of a transistor device including six transistors of the type shown in FIGS. 2A-2C.
Figure 3B:
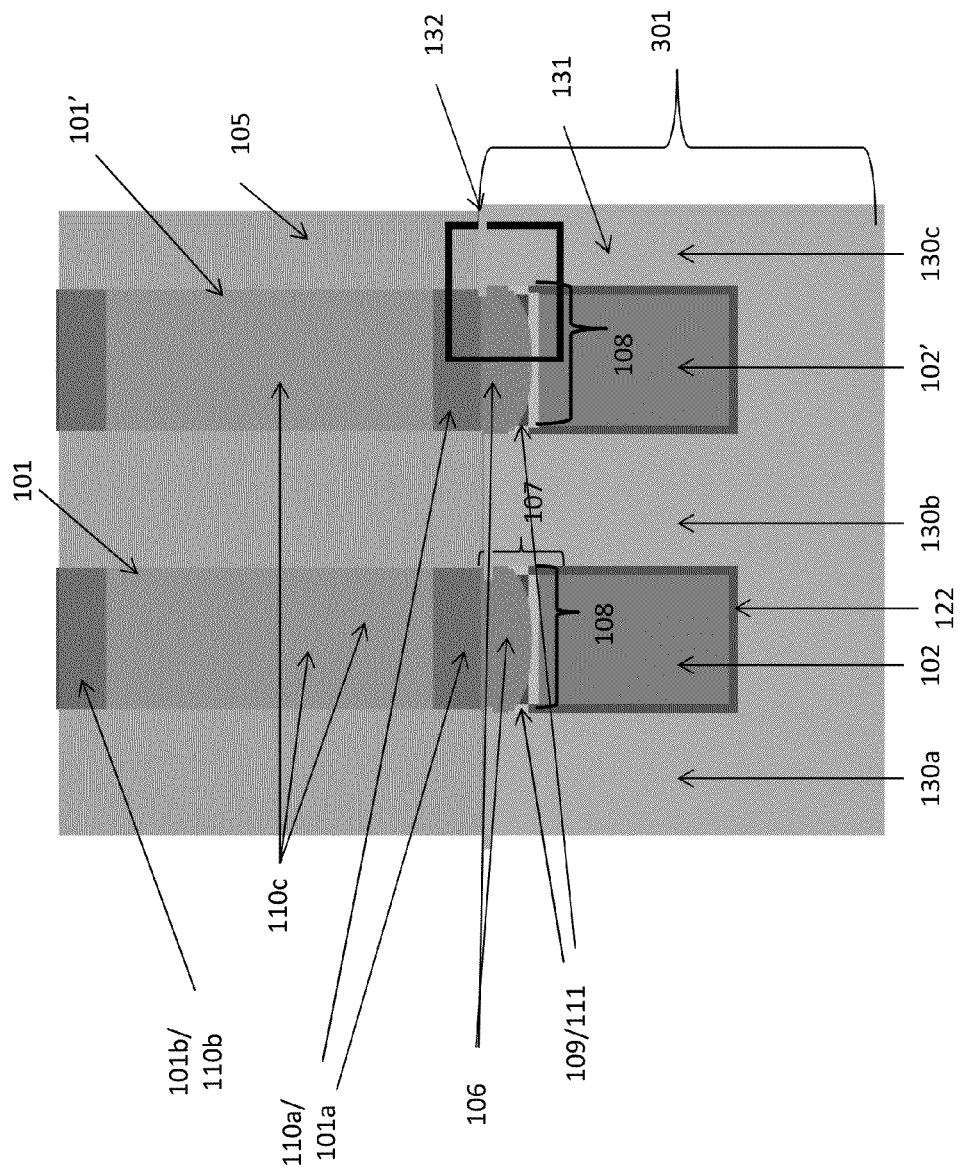
FIG. 3B shows a side cross section view of the device of FIG. 3A in the plane parallel to the x-direction through the line A-A in FIG. 3A.
Figure 3C:
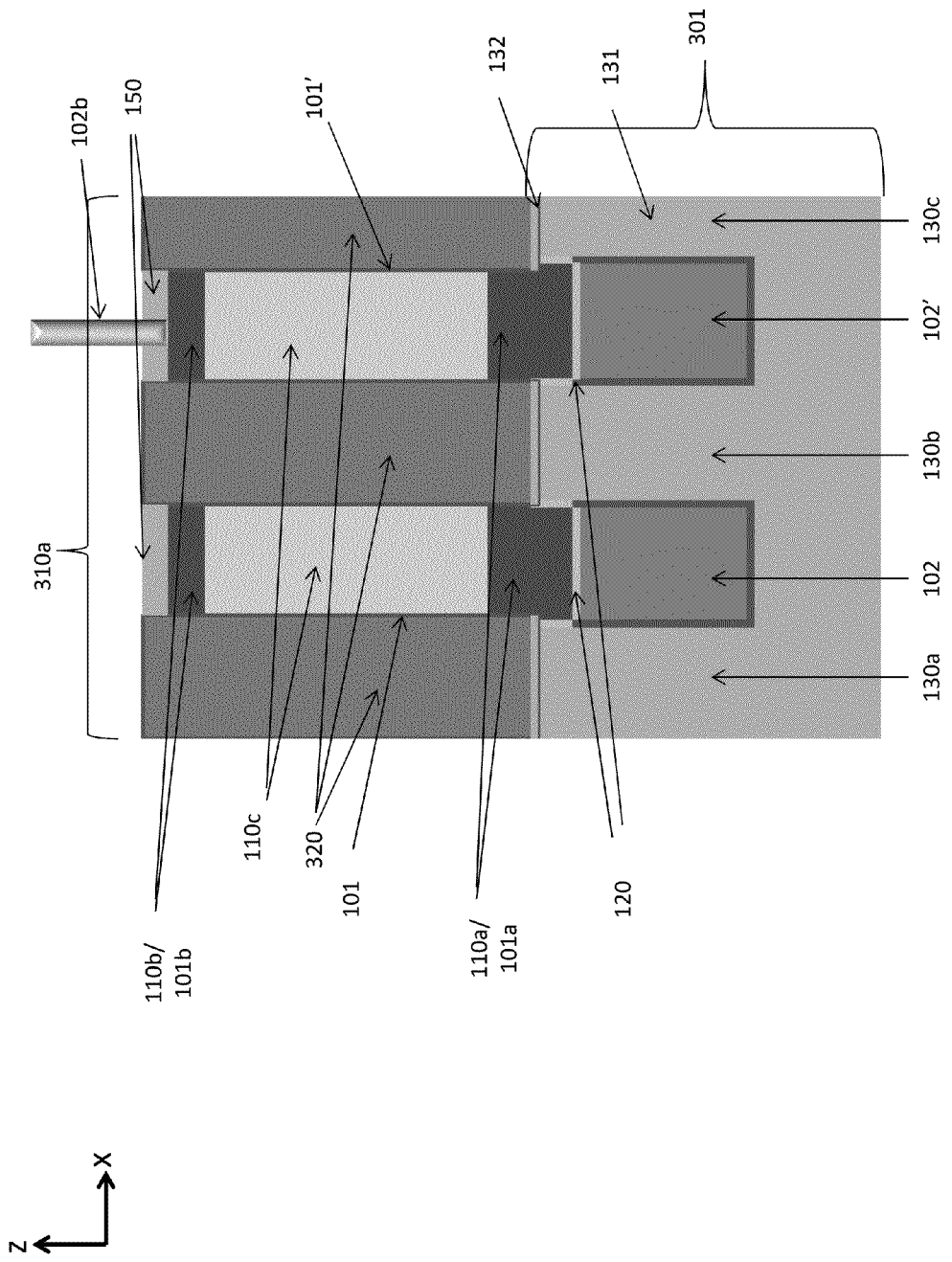
FIG. 3C shows a side cross section view of the device of FIG. 3A in the plane parallel to the x-direction through the line B-B in FIG. 3A.

Referring to FIGS. 3A-C, a device 300 includes a plurality of transistors 100 of the type described above with reference to FIGS. 2A-2C. Although six transistors 100 disposed in a 2×3 array are shown in FIG. 3A, in various embodiments any suitable number or arrangement may be used. For example, e.g., 1, 2, 3, or more transistors 100 may be used, such as 1-10, 1-100, 1-1,000, 1-10,000, 1-100,000, 1-1,000,000, 1-1,000,000,000 transistors or any subrange of any of the preceding ranges. For example, in some embodiments, the structure shown in FIG. 3A may repeat one or more times in each of the x- and y-directions.

The device 300 includes a base 301 comprising a plurality of electrically conductive contact lines (as shown two lines) 102 and 102' horizontally alternating with a plurality of electrically insulating lines 130a, 130b, and 130c. The insulating lines 130 insulate each of the plurality of electrically conductive contact lines 102/102' from the others of the plurality of electrically conductive contact lines 102'/102. For example, as shown, insulating line 130b insulates conductive contact line 102 from conductive contact line 102'.

In some embodiments, each of the plurality of electrically insulating lines 130 comprises an upper layer 132 of a first electrically insulating material overlaying a lower layer 131 of a second electrically insulating material. For example, in some embodiments, the lower layer 131 comprises an oxide material, such as a silicon oxide, and the upper layer 132 comprises a nitride material, such a silicon nitride.

The base 301 has a top surface 303 comprising recesses 302 and 302' overlaying the electrically conductive contact lines 102 and 102' respectively. The recesses 302 and 302' extending in a first horizontal direction (e.g., as shown in FIG. 3, the y-direction) along each of the plurality of the electrically conductive contact lines 102 and 102'.

As shown, the device 300 includes three pairs of pillars 101 and 101' of semiconductor material. However, in various embodiments any number or arrangement of pillars may be used.

Each transistor 100 includes a respective one of the pillars 101/101'. As detailed in FIG. 3C, each pillar 101/101' extends vertically (as shown in FIGS. 3A-3C, in the z-direction) from a bottom portion 101a in direct or indirect (e.g., via the barrier 120) electrical contact with a respective one of the plurality of electrically conductive contact lines 102/102'. The pillars 101 and 101' extend through a respective one of the plurality of recesses 302/302' overlaying the electrically conductive contact lines 102/102' to a top portion 101b located vertically above the top surface 303 of the base 301. For each pillar 101/101', a portion of the respective electrically conductive contact line 102/102' and the respective overlaying recess 302/302' extend from a lateral side of the pillar along the first horizontal direction (as shown in FIG. 3A, the y-direction).

In some embodiments, the electrically conductive contact lines 102 and 102' may comprise or be in electrical contact with the one of global bit lines (GBL) of the ReRAM device shown in FIG. 1. For example, the electrically conductive contact lines 102 and 102' may comprise or be in electrical contact with global bit lines $GBL_1$ and $GBL_2$, respectively.

As discussed in detail with reference to FIGS. 2A-2C, one or more (as shown two) gate electrodes 105 extend along lateral sides of each of the pillars 101/101' and are electrically insulated from the pillars 101 by a gate insulating liner layer 103.

As discussed in detail with reference to FIGS. 2A-2C, each of the plurality of pillars 101/101' may comprise a channel layer 110c of a first conductivity type semiconductor material sandwiched between a source or drain layer 110a of a second conductivity type semiconductor material and a drain or source layer 110b of the second conductivity type semiconductor material. A layer of insulating material 150 may cover the top surface of each of the pillars 101/101'. In some embodiments, the insulating material may comprise an oxide material, such as a silicon oxide, or a nitride material such a silicon nitride. In some embodiments a nitride layer 150 may advantageously protect the underlying pillar 101 of semiconducting material during fabrication.

A semiconductor oxide material 106 fills at least portions of the recesses 302/302' extending laterally from the lateral side of each of the pillars 101 to form gate bottom insulation regions filing spaces 107A between bottom portions of the one or more gate electrodes 105 and the top portions of the plurality of electrically conductive contact lines 102/102'. As discussed above, in some embodiments, portions of the gate insulating liner layer 103 may be sandwiched between a top surface of semiconductor oxide material 106 and a bottom surface of the gate electrode 105.

As shown in detail in FIGS. 3B and 3C, each transistor 100 in the device 300 has a structure analogous to that shown in FIGS. 2B-2C. A region of electrically insulating semiconductor oxide material 106 (e.g., a silicon oxide) fills (e.g., partially, substantially, or completely fills) a space 107 (defined by the recess 108/302, e.g., by portion 108 of the railed shaped recesses 302) between a bottom portion of the gate electrode 105 and a top portion of the electrically conductive contact line 102/102'. In some embodiments, the electrically insulating semiconductor oxide material 106 can advantageously reduce or eliminate current leakage between the gate electrodes 105 and the electrically conductive contact line 102/102'.

As detailed above with reference to FIGS. 2B and 2C, in some embodiments, the region of electrically insulating semiconductor oxide material 106 substantially fills the recess 108 (defining the space 107) above an electrically conductive contact line 102. Corners of the recess 108 may include an unoxidized semiconductor (e.g., silicon) material residue 109 disposed below the region of electrically insulating semiconductor oxide material. Additionally or alternatively, corners of the recess 108 may include oxidized metal material residue 111 (e.g., metal oxide, such as titanium oxide or oxynitride, tungsten oxide or oxynitride, etc.) from oxidized portions of the optional bather metal layer 120 (as shown in FIG. 2B) disposed between a pillar of semiconductor material 101/101' and the electrically conductive contact line 102/102'.

As shown in FIGS. 3A-3C, the pillars are arranged to form three lines 310a, 310b, 310c each comprising a pair of pillars 101 and 101' arranged along a horizontal line extending along a second horizontal direction (as shown the x-direction) transverse to the first horizontal direction (as shown, the y-direction) along which the electrically conductive contact lines 102/102' extend. In other embodiments, each line of pillars 310 may include more than two pillars 101/101', and more or fewer than three lines of pillars 310 may be used.

For each of the lines 310a, 310b, 310c of pillars 101/101' extending along the x-direction, an inter-pillar electrically insulating fill material 320 fills lateral spaces separating the pillars 101 and 101' in the line. Accordingly, a wall structure is formed for each line 310a, 310b, and 310c made up of alternating pillars 101/101' and fill material 320 extending along the x-direction. In some embodiments the inter-pillar electrically insulating fill material 320 may comprise an oxide material, such as a silicon oxide, or a nitride material, such a silicon nitride.

For each of the lines 310a, 310b, 310c of pillars 101 extending along the x-direction, a pair of gate electrodes 105 extend along opposing lateral sides of the line (as shown in FIG. 3A, the left and right sides). Accordingly, the transistors 100 including pillars 101/101' that are disposed along a common line 310a, 310b, or 310c will share a common pair of gate electrodes 105. Of course, in other embodiments, a single gate electrode 105 (or more than two gate electrodes) may be used for each line 310 of pillars 101.

In some embodiments, the first and/or second gate electrodes 105 may comprise or be in electrical contact with one of the select gate lines (SG) of the ReRAM device shown in FIG. 1. For example, the pairs of gate electrodes contacting the line 310a, 310b, and 310 may comprise or be in electrical contact with select gate lines SG1, SG1, and SG3 respectively.

In some embodiments, the upper insulating layer 132 in the base 301 and the layer of insulating material 150 covering the top surface of each of the pillars 101 may comprise the same material, e.g., a nitride, such as silicon nitride. In some embodiments, the lower insulating layer 131 in the base 301 and the inter-pillar electrically insulating fill material 320 may comprise the same material, e.g., an oxide, such as silicon oxide.

As shown in FIG. 3A, the pillars 101/101' also form two lines 311 and 311' of pillars extending along the direction parallel to the elongated electrically conductive contact lines 102 and 102' (the y-direction). The pillars 101/101' in each line 311 and 311' are in common electrical contact with the electrically conductive contact lines 102 and 102', respectively.

In some embodiments, some or all of the transistors 100 may include a source or drain contact line 102b in electrical contact with a top portion 101a of the corresponding pillar 101/101'. For clarity only one contact line 102b is shown, however and number of contact lines 102b may be used, e.g., one per transistor 100 in the device 300.

In some embodiments, the conductive contact line 102b may extend through an insulating layer 150 (e.g., an oxide or nitride layer) formed over a top surface of the top portion 101b of the pillar 101. For example, in some embodiments a portion of the contact line 102b may fill a via hole extending through the insulating layer 150.

In some embodiments, the second electrically conductive contact line 102b may comprise or make electrical contact with the one of the local bit lines (LBL) of the ReRAM device shown in FIG. 1. For example, one of each of the six transistors 100 in the device 300 shown in FIG. 3A may be in contact with a respective one of the local bit lines $LBL_{11}$, $LBL_{12}$, $LBL_{13}$, $LBL_{21}$, $LBL_{22}$, and $LBL_{23}$ of the ReRAM device shown in FIG. 1.

FIGS. 4A-4I illustrate a method of making one or more transistors, such as transistors 100 in device 300.

Figure 4A:
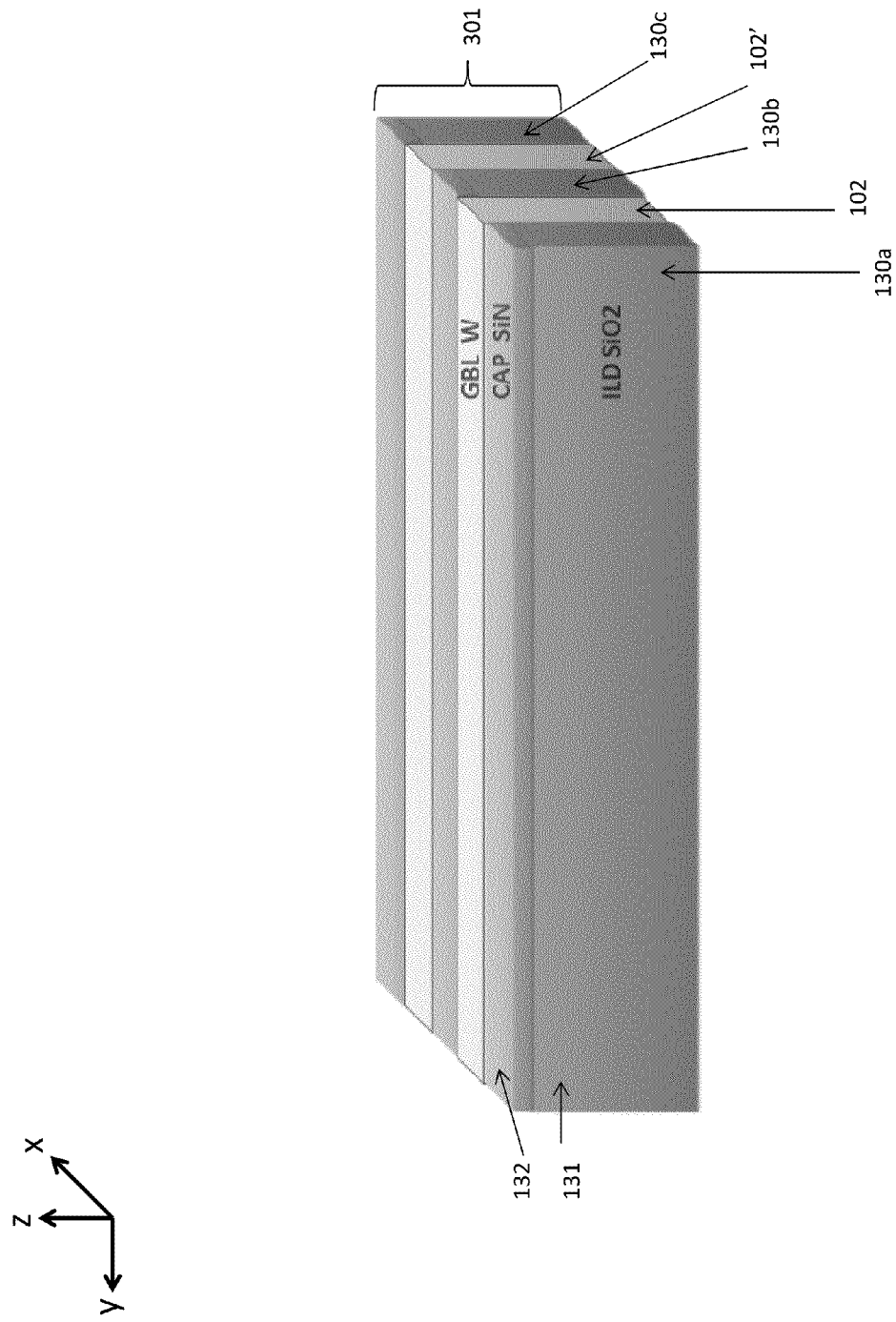
FIGS. 4A-4J show perspective views of a process for fabricating the device shown in FIGS. 3A-3B.

Referring to FIG. 4A, a first step includes providing a base 301 comprising a plurality (e.g., two, as shown, or any other suitable number) of electrically conductive contact lines 102 and 102' horizontally alternating with a plurality (e.g., three, as shown, or any other suitable number) of electrically insulating lines 130a, 130b, and 130c. The plurality of electrically insulating lines 130a, 130b, and 130c insulate each of the plurality of electrically conductive contact lines 102/102' from the others of the plurality of electrically conductive contact lines 102'/102. For example, as shown, insulating line 130b insulates conductive contact line 102 from conductive contact line 102'.

The base 301 may be formed using any suitable technique including, e.g., damascene processes or etch back techniques. In some embodiments, the electrically conductive contact line 102a may include W, Mo, Cr, a noble metal, metal nitride, or a metal silicide formed in recesses in base 301.

If desired, the recesses may lined with the liner 122. Alternatively, the conductive contact lines 102 may be formed first, followed by filling the spaces between the lines with insulating lines.

In some embodiments, each of the plurality of electrically insulating lines 130 comprises an upper layer 132 of a first electrically insulating material overlaying a lower layer 131 of a second electrically insulating material. For example, in some embodiments, the lower layer 131 comprises an oxide material, such as a silicon oxide, and the upper layer comprises a nitride material, such a silicon nitride.

Figure 4B:
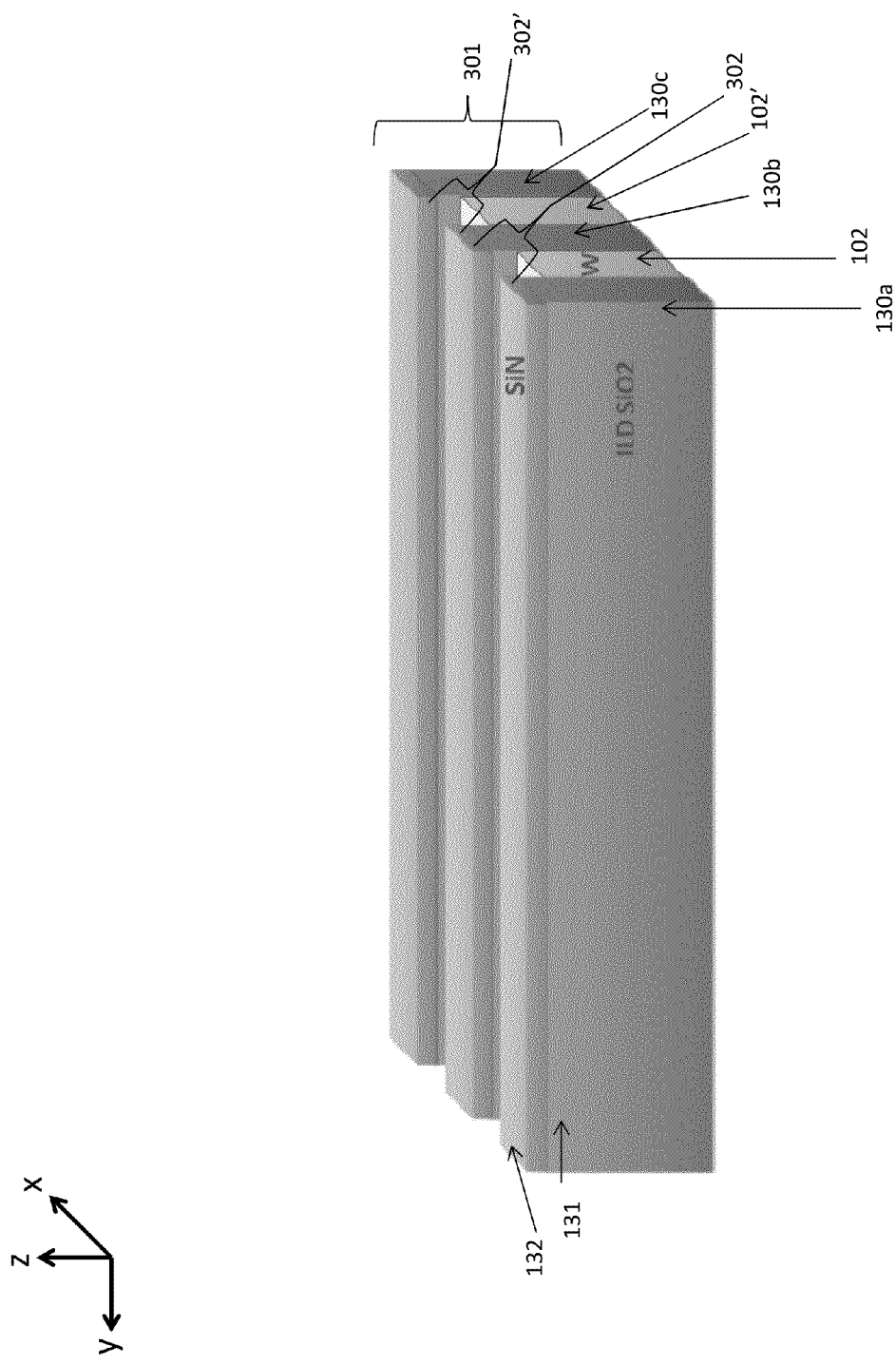

Referring to FIG. 4B, another step includes forming recesses 302 and 302' in a top surface of the plurality of electrically conductive contact lines 102 and 102'. For example, the recesses may be formed by selectively removing material from the top portions of the electrically conductive contact lines 102 and 102', e.g., using any suitable technique, including wet or dry etching. In some embodiments, the top layer 132 of the electrically insulating lines 130a, 130b, and 130c serves as a mask or etch stop to prevent removal of the material from the underlying lower layer 131. For example, the upper layer 132 may be a relatively thin masking layer of a nitride material, such as silicon nitride, that protects a lower layer 131 made of a less etch resistant oxide material, such as a silicon oxide (e.g. $SiO_2$).

Figure 4C:
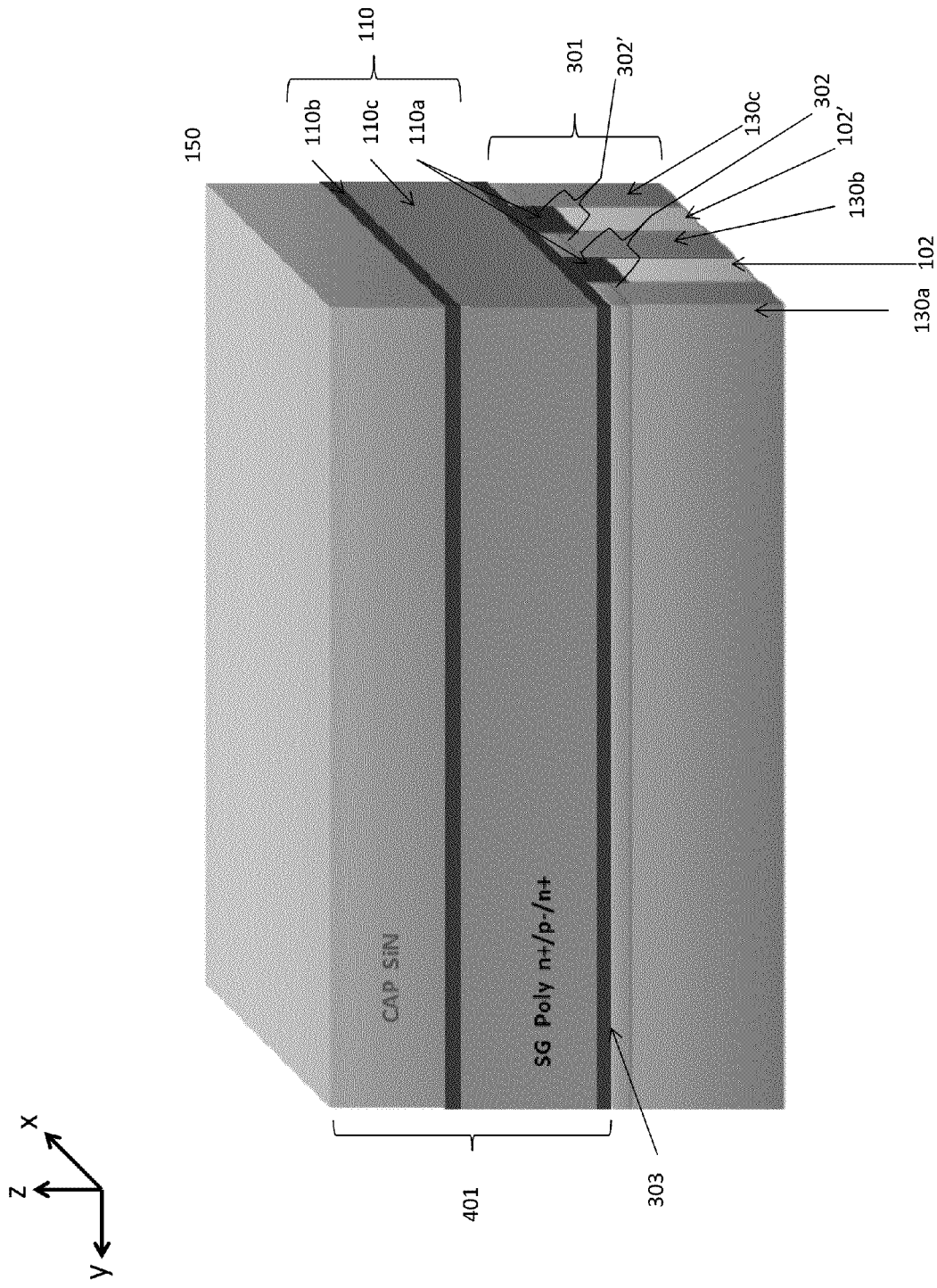
Figure 5A:
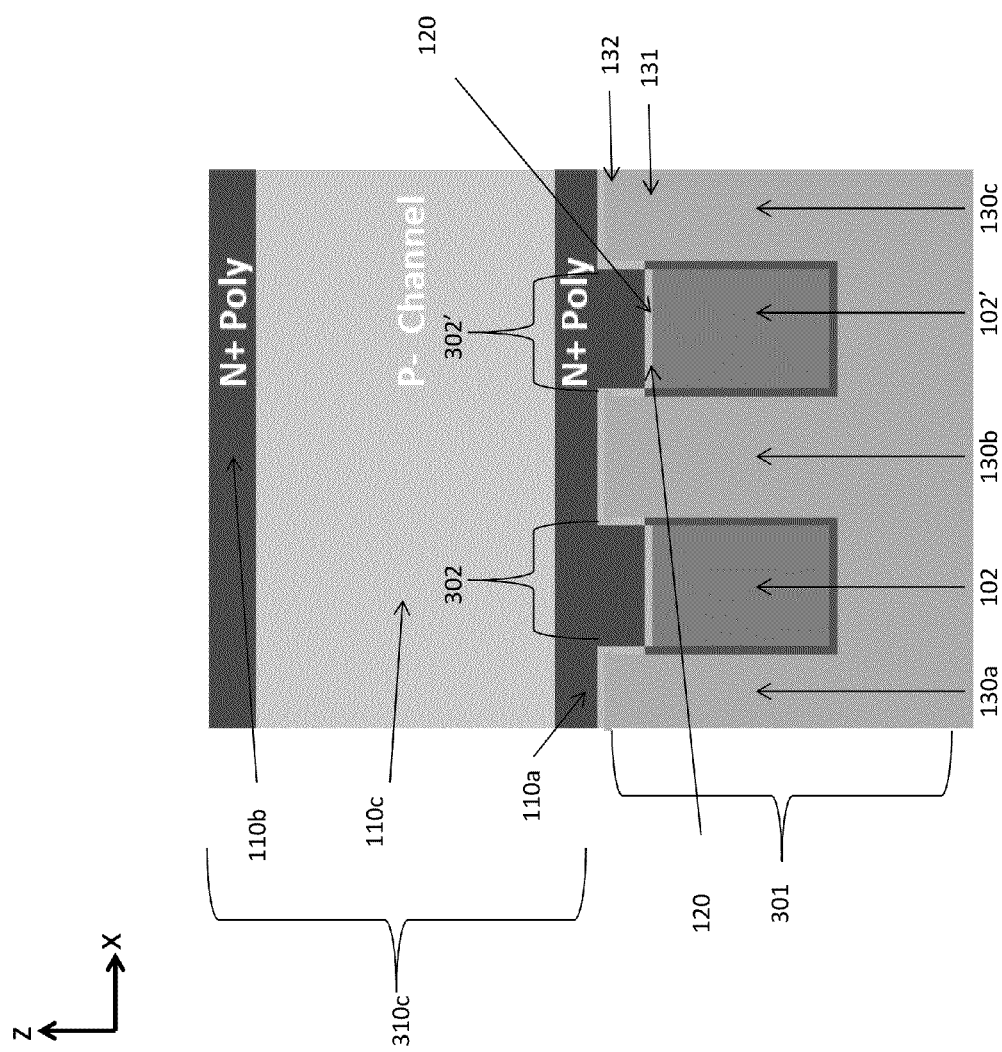
FIG. 5A is a side cross sectional view of the structure shown in FIG. 4C.

Referring to FIGS. 4C and 5A, a next step includes forming a layer stack 401 comprising at least one layer 110 of semiconductor material on a top surface 303 of the base 301, where the semiconductor material from the layer 110 extends into and fills the recesses 302. FIG. 5A is cross sectional view of FIG. 4C along the x-direction.

As shown, the layer stack 401 includes a channel layer 110c of a first conductivity type semiconductor material sandwiched between a source or drain layer 110b of a second conductivity type semiconductor and a drain or source layer 110a of the second conductivity type semiconductor material. In the example shown in FIGS. 4A-4I, the first conductivity type is p-type and the second conductivity type is n-type. In other embodiments, the first conductivity type is n-type and the second conductivity type is p-type. In some embodiments, the semiconductor material comprises polycrystalline semiconductor material, such as polycrystalline silicon. However, in other embodiments other types of suitable semiconductor material may be used, e.g., amorphous or microcrystalline silicon, compound semiconductors (e.g., cadmium selenide or gallium arsenide), etc.

In some embodiments, the layer stack 401 may include a layer of electrically insulating material 150 overlaying the at least one layer of semiconductor material 110 (e.g. the sandwich of semiconductor layers 110a, 110b, and 110c). In some embodiments the insulating material 150 may comprise an oxide material, such as a silicon oxide, or a nitride material, such as silicon nitride. For example, in some embodiments, the insulating layer 150 may be a nitride layer that may advantageously protect the underlying semiconductor material layers 110a, 110b, and 110c during subsequent steps in the process (e.g., etch steps).

Figure 4I:
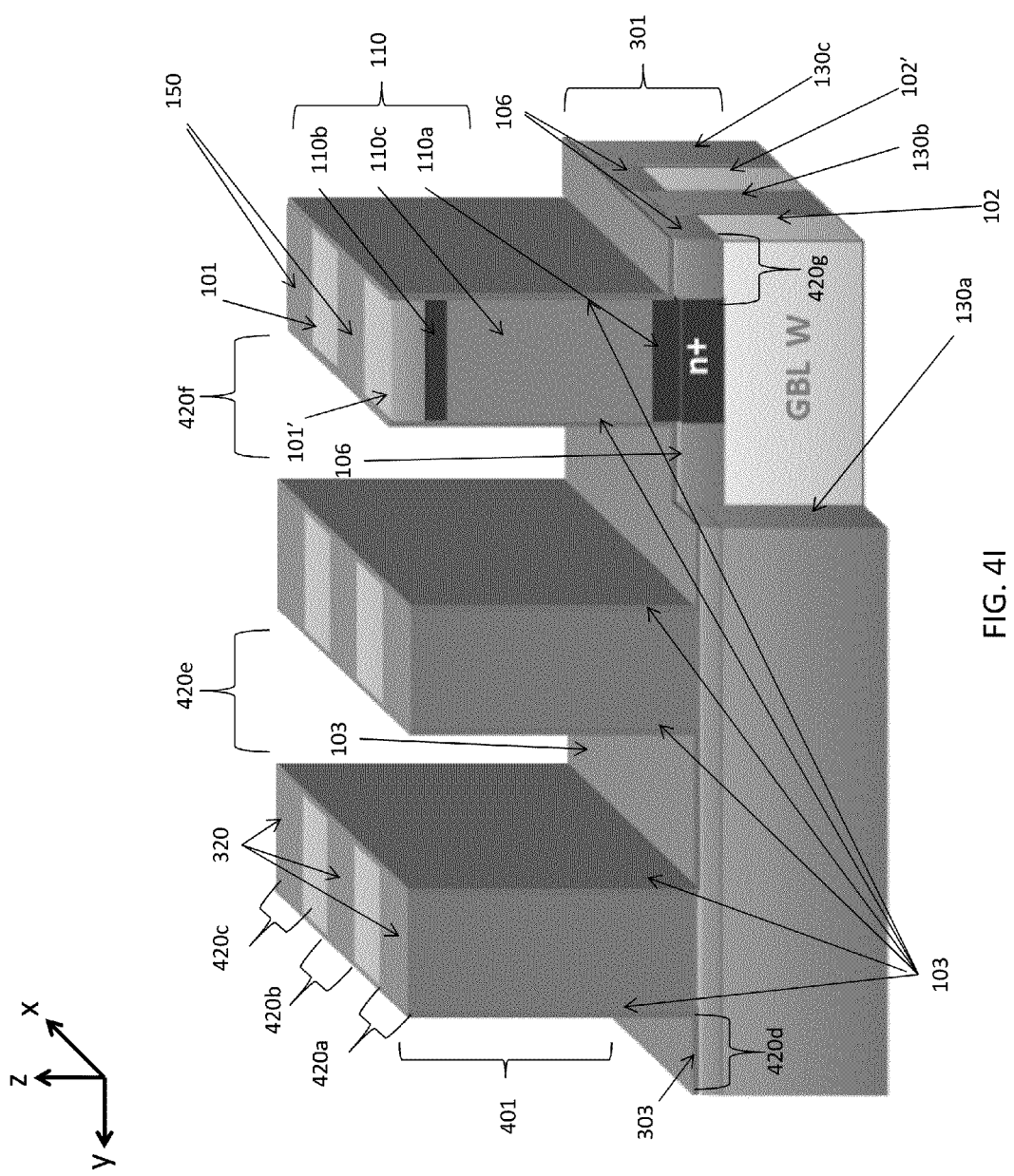
Figure 5B:
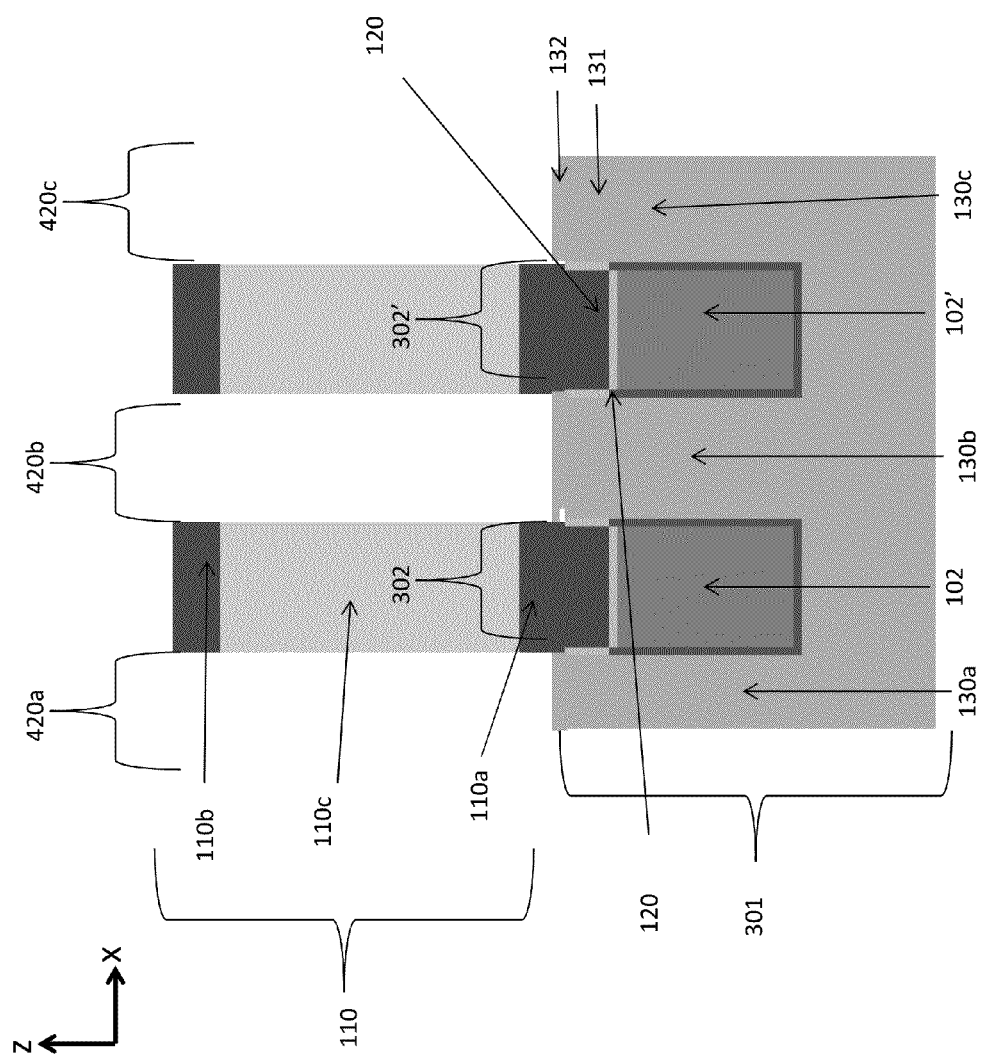
FIG. 5B is a side cross sectional view of the structure shown in FIG. 4D.

In some embodiments, the layer stack comprises an optional barrier metal layer 120 disposed between the plurality of electrically conductive contact lines 102/102' and a bottom surface of the at least one semiconductor layer 110, e.g., as shown in FIGS. 5A and 5B. In some embodiments, the barrier layer 120 is configured to inhibit compound formation between the plurality of electrically conductive contact lines 120/120' and the at least one semiconductor layer 110 during subsequent processing steps, e.g., during the gate bottom oxide formation step described in detail below with reference to FIG. 4I.

In various embodiments the layer stack 401 may be formed using any suitable technique including sputtering, deposition (chemical vapor deposition, physical vapor deposition, plasma enhance chemical vapor deposition, etc.).

Figure 4D:
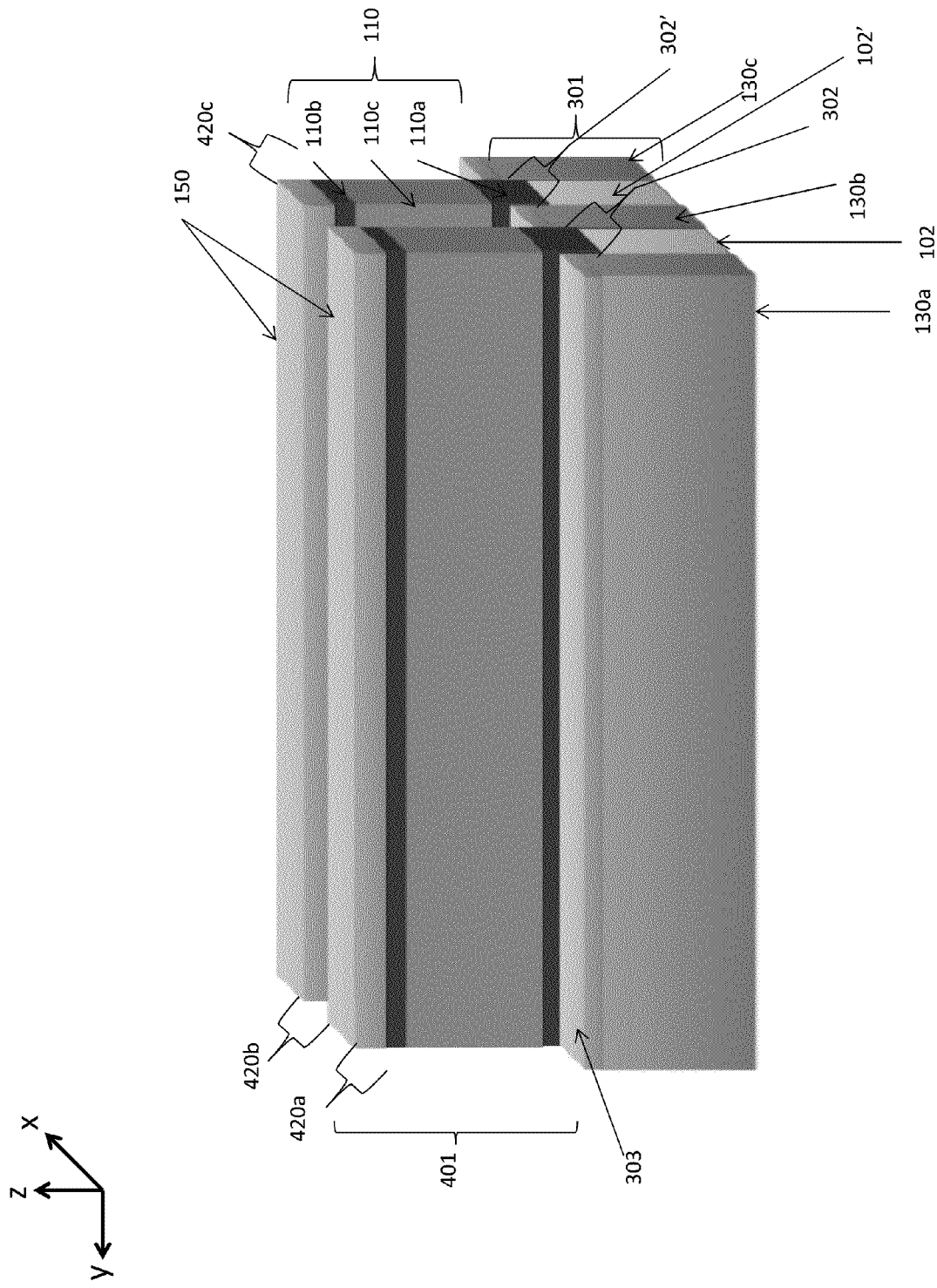

Referring to FIGS. 4D and 5B, a next step includes patterning the layer stack 401 to expose the plurality of electrically insulating lines 130a, 130b, and 130c and form first plurality of trenches 420a, 420b, and 420c extending horizontally in the layer stack 401 overlaying the exposed plurality of electrically insulating lines 130a, 130b, 130c. FIG. 5B is a cross sectional view of FIG. 4D in the y-direction. As shown, the trenches 420a, 420b, and 420c extend in the y-direction.

In various embodiments, the step of forming trenches 420a, 420b, and 420c in the layer stack 401 may include any suitable patterning technique. For example, a patterned mask (e.g., a hard mask and/or photoresist) may be formed using photolithography and etching that exposes only portions of the underlying structure intended for removal. An etching process may then be used remove exposed portions of the layer stack 401. The mask may then be removed, e.g., using a chemical mechanical polishing process (or etching for a hardmask or ashing for a photoresist) to expose a top surface of the remaining layer stack 401.

In some embodiments, the base 301 may act as an etch stop during the process of removing portions of the layer stack 401, such that the top surface 303 of the base 301 forms the floor of the trenches 420a, 420b, and 420c. For example, in some embodiments the upper layer 132 may include a material (e.g., silicon nitride) that is resistant to an etching process used to the remove portions of the layer stack 401 to form the trenches 420a, 420b, and 420c.

Figure 4E:
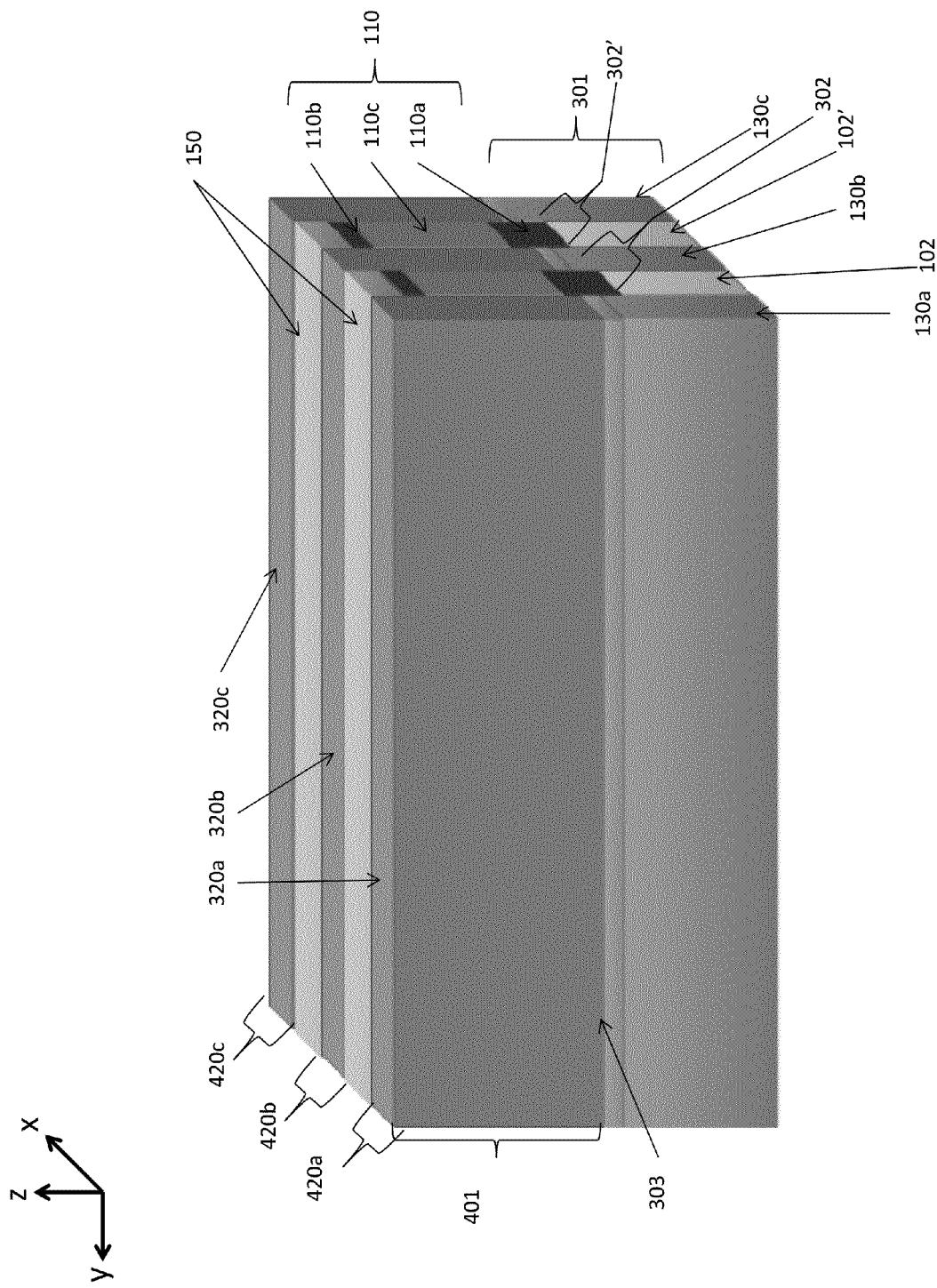

Referring to FIG. 4E, a next step includes filling the first plurality of trenches 420a, 420b, and 420c with an electrically insulating fill material 320. In some embodiments the insulating fill material 320 may comprise an oxide material, such as a silicon oxide, or a nitride material, such a silicon nitride. In some embodiments the top of layer stack 401 and fill material 320 may be planarized (e.g., using chemical mechanical polishing or some other suitable technique).

Figure 4F:
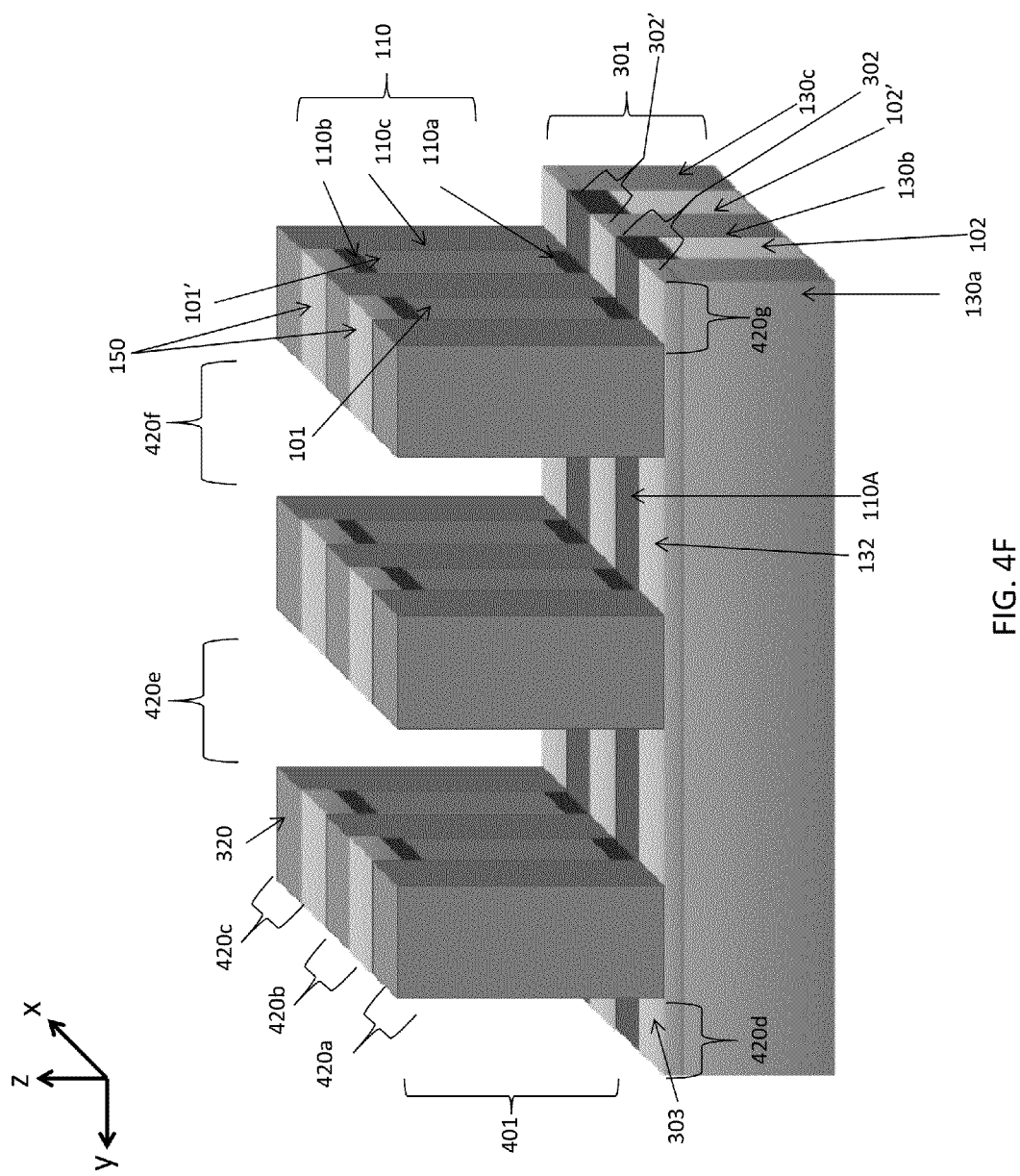

Referring to FIG. 4F, a next step includes patterning the layer stack 401 and the electrically insulating fill material 320 to form a second plurality of trenches 420d-420g extending horizontally in a direction transverse to the first plurality of trenches 420a-420c. As shown, the trenches 420d-420g extend along the x-direction. The bottom of each the second plurality of trenches 420d-420g comprises horizontally alternating exposed regions of the upper insulating layer 132 of the base 301 and the semiconductor material 110a filing the recesses 302 and 302'.

This patterning step may result in a plurality of pillars 101/101' of the semiconductor material 110 (e.g., including source, drain, and channel portions 110b, 110a, and 110c). Each pillar 101/101' extends vertically (as shown, in the z-direction) from a respective one of the plurality of electrically conductive contact lines 102/102'. Accordingly, each of the plurality of pillars 101/101' may include a channel region 110c for a corresponding transistor 100.

In various embodiments, the step of forming trenches 420d-420g in the layer stack 401 may include any suitable patterning technique. For example, a patterned mask (e.g., a hard mask and/or photoresist) may be formed using photolithography and etching that exposes only portions of the underlying structure intended for removal. An etching process may then be used remove exposed portions of the layer stack 401 and fill material 320. The mask may then be removed, e.g., using a chemical mechanical polishing process (or etching for a hardmask or ashing for a photoresist) to expose the top of the remaining layer stack 401 and fill material 320.

In some embodiments, the base 301 may act as an etch stop during the process of removing portions of the layer stack 401 and fill material 320, such that the top surface 303 of the base 301 forms portions of the floor of the trenches 420d-420g. For example, in some embodiments the upper layer 132 may include a material (e.g., silicon nitride) that is resistant to an etching process used to the remove portions of layer stack 401 and fill material 320 to form the trenches 420d-420g.

Figure 4G:
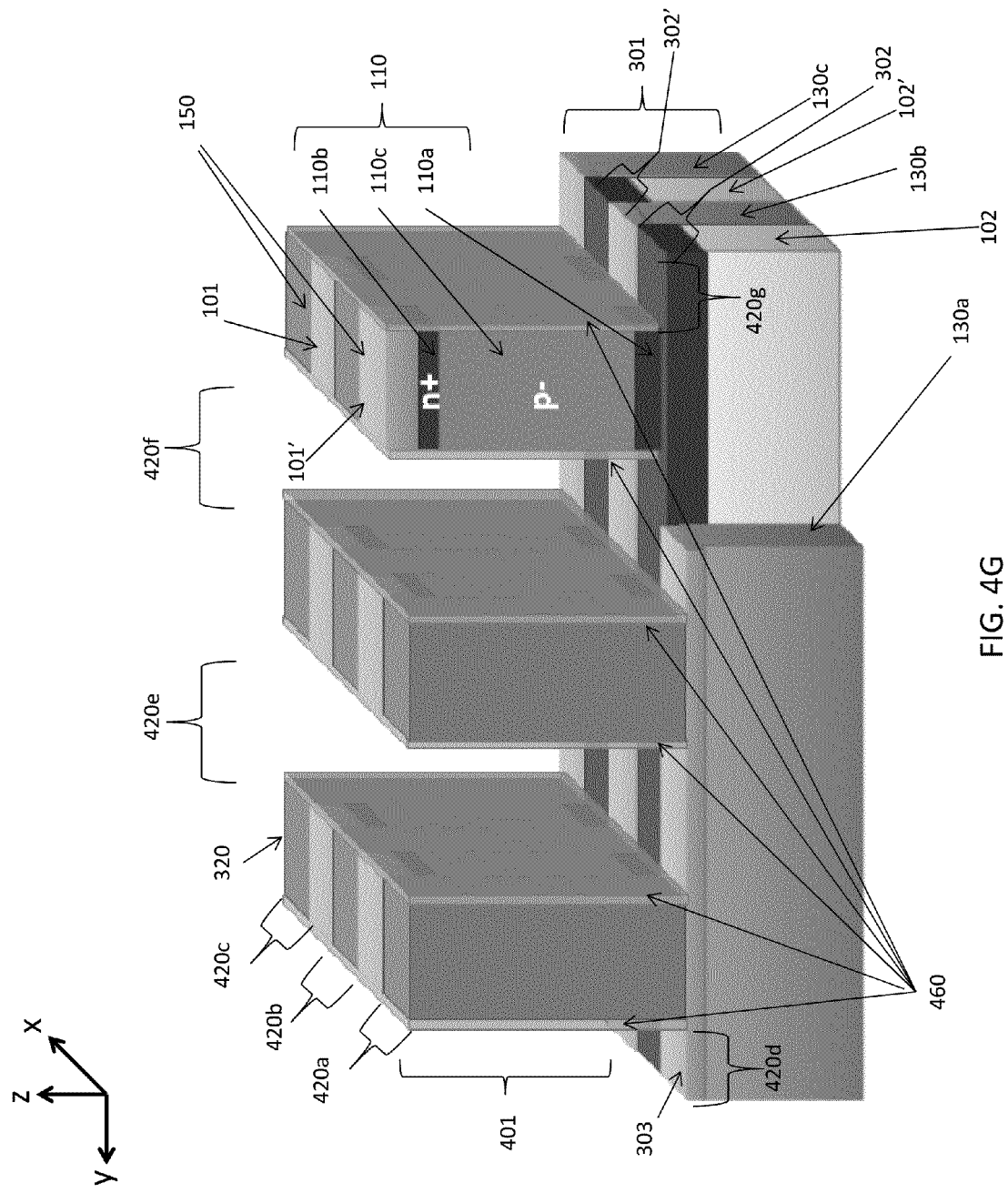

Referring to FIG. 4G, in an optional step, an oxidation blocker liner layer 460 may be formed on the lateral sides of the trenches 420d-420g extending in the x-direction. For example, the oxidation blocker liner layer 460 may be made by forming a conformal layer over the exposed surfaces of the base 301, the remaining portions of the layer stack 401, and the fill material 320 and then etching back the conformal layer to remove all portions other than the vertical portions formed on the lateral sides of the trenches 420d-420g (e.g., a sidewall spacer etch). The oxidation blocker liner layer 460 may comprise any suitable material that prevents oxidation of the portions of the semiconductor material 110 that extend vertically above the top surface 303 of the base layer 301 during the oxidation step described below. For example, in some embodiments, oxidation blocker liner layer 460 comprises silicon nitride.

Figure 4H:
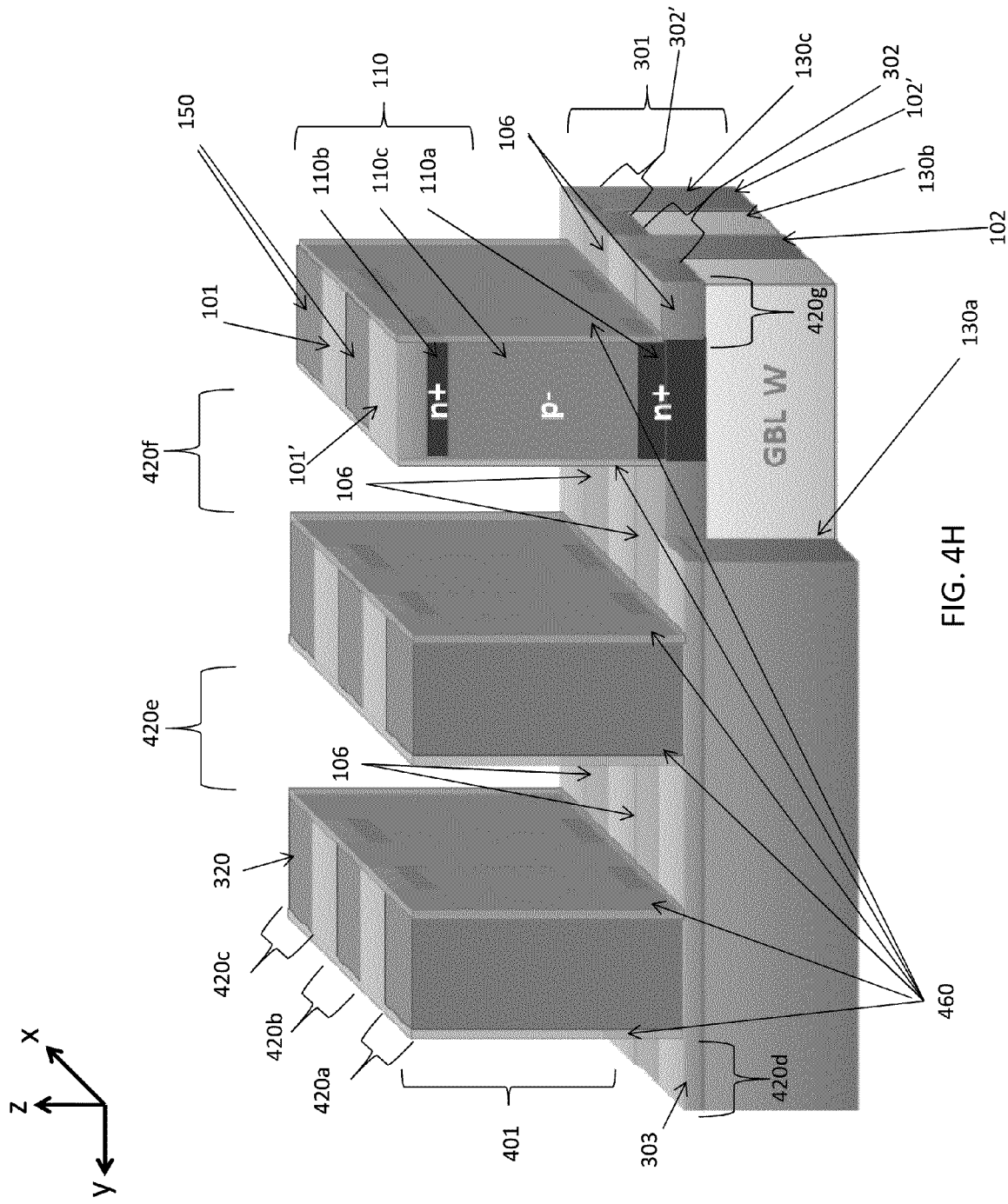

Referring to FIG. 4H, a next step includes oxidizing regions of the semiconductor material 110 filing the portions 108 of recesses 302 and 302' between the pillars 101/101' to form one or more insulating oxide regions 106. For example, in some embodiments, the oxidation may be accomplished by annealing the structure shown in FIG. 4F or FIG. 4G in the presence of oxygen. In embodiments where a barrier metal layer 120 is used, exposed portions of the barrier metal layer 120 (e.g., located along the floors of the trenches 420d-420g will also be oxidized to form oxidized metal (e.g., metal oxide) regions 111.

In some embodiments, the oxidation process will form a residue of material indicative of the process. For example, as discussed in detail above with reference to FIGS. 2C and 3C, a residue may be formed in corners of the plurality of recesses 108, wherein the residue comprises one or both of an unoxidized semiconductor material 109 from portions the semiconductor material layer 110 extending into the plurality of recesses 108 and an oxidized metal material residue 111 (e.g., a metal oxide and/or a metal oxynitride) from the barrier metal layer 120 (as shown in FIGS. 5A and 5B).

Referring to FIG. 4I, a next step includes forming a gate insulating liner layer 103 of electrically insulating material on lateral sides and bottom of each of the second plurality of trenches 402d-402g extending in the x-direction. The gate insulating liner layer 103 may be, e.g., deposited or formed by oxidation. In embodiments where oxidation blocker liner layer 460 has been used, the oxidation blocker liner layer 460 may be removed (e.g., by etching) prior to forming the gate insulating liner layer 103. The gate insulating liner layer 103 may comprise any suitable insulating material, such as an oxide (e.g., silicon oxide) or a nitride (e.g., silicon nitride).

Some embodiments include removing portions of the gate insulating liner layer 103 (e.g., via an etching or planarization process) to expose a top surface of the pillars 101/101' and the fill material 320 disposed between the pillars 101/101'.

Figure 4J:
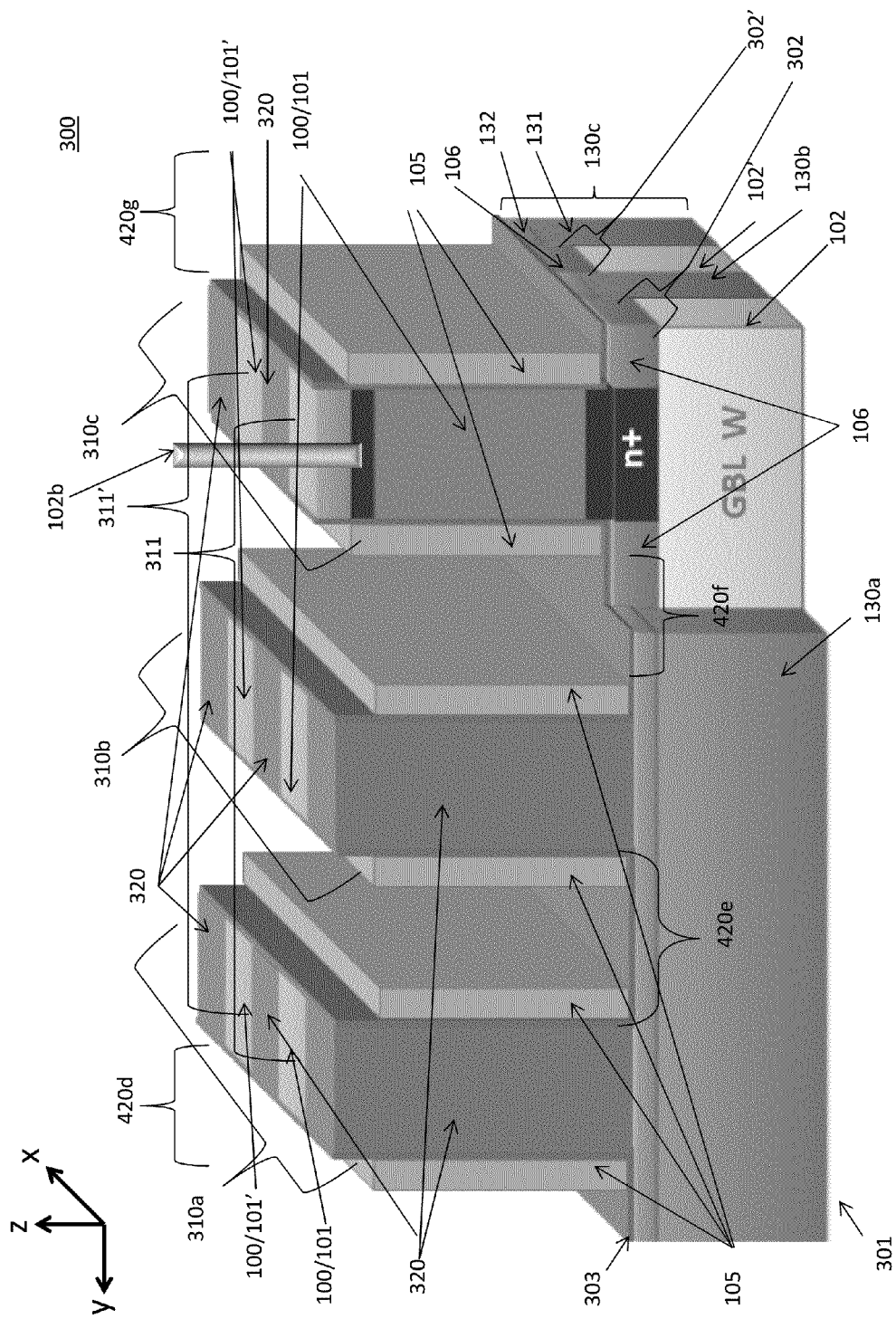

Referring to FIG. 4J, a next step includes forming a plurality of electrically conductive gate electrodes 105 in the plurality of trenches 402d-402g extending in the x-direction. The resulting structure corresponds to that device 300 shown in FIG. 3A. As described in detail above with reference to FIGS. 3A-3C, insulating oxide regions 106 act as gate bottom insulators, reducing or preventing current leakage between the bottom portions of the electrically conductive gate electrodes 105 and the electrically conductive contact lines 102/102'.

As described in detail reference to FIGS. 3A-3C, in some embodiments, the upper insulating layer 132 in the base 301 and the layer of insulating material 150 covering the top surface of each of the pillars 101 may be formed of the same type of material, e.g., a nitride, such as silicon nitride. In some embodiments, the lower insulating layer 131 in the base 301 and the inter-pillar electrically insulating fill material 320 may be formed of the same type of material, e.g., an oxide, such as silicon oxide.

In some embodiments, the method may further include a top contact formation step that includes forming source or drain contact line 102b in electrical contact with a top portion of the corresponding pillar 101/101'. For clarity, only one contact line 102b is shown, however and number of contact lines 102b may be used, e.g., one per transistor 100 in the device 300.

Some embodiments include a second electrically conductive contact line 102b that comprises the other one of a source or a drain contact line of the transistor. The second electrically conductive contact line 102b may be in electrical contact with a top portion 101b of the pillar. In some embodiments, a portion of the conductive contact line 102b may fill a via hole that has been formed in formed in an insulating layer 150 (e.g., an oxide or nitride layer) formed over a top surface of the top portion 101b of the pillar 101.

Some embodiments may include forming a three dimensional solid state memory device, where the transistors 100 (e.g., field effect transistors) in the pillars 101 each comprise a memory cell select gate for the three dimensional solid state memory device. For example, as described above, the three dimensional solid state memory device may include a three dimensional ReRAM memory device. In some embodiments, the ReRAM memory cells shown in FIG. 1 may be formed monolithically over the device shown in FIG. 4J. The source 110b and/or source contact line 102b for each transistor 100 connects electrically to a local bit line LBL of the device of FIG. 1, such that each transistor 100 acts as a select transistor for the ReRAM memory cells.

Similarly, in other embodiments, NAND memory cells described in FIGS. 6A-7B below may be formed monolithically over the device shown in FIG. 4J, with electrical connections as shown in FIGS. 6A and 6B and described in detail below, such that each transistor 100 acts as a bottom select transistor for the vertical NAND memory cells in a monolithic three dimensional NAND memory device. For example, the transistor 100 acts as a source side select transistor for the NAND string. The source and drain regions 110b and 110a and the source and drain lines 102b and 102a of the transistor 100 may be reversed if the bottom of the vertical NAND string is the drain side of the string and the transistor 100 acts as a drain side select transistor for the NAND string.

Referring to FIGS. 6A-7B, in some embodiments, the monolithic three dimensional NAND string 1180 comprises a semiconductor channel 1 having at least one end portion extending substantially perpendicular to a major surface 1100a of a base layer 1100, as shown in FIGS. 6A and 7A. For example, the semiconductor channel 1 may have a pillar shape and the entire pillar-shaped semiconductor channel in the NAND memory cell area extends substantially perpendicularly to the major surface 1100a of the base layer 1100, as shown in FIGS. 6A and 7A. In these embodiments, the source/drain electrodes of the device can include an upper electrode 1202 (e.g., drain electrode or contact line) formed over the semiconductor channel 1, as shown in FIGS. 6A and 7A. A drain select transistor at the top of the channel is not shown for clarity. An optional body contact electrode 1102 may be disposed in the base layer 1100 to provide body contact to the connecting portion of the semiconductor channel 1 from below. The NAND string's 1180 select gate or access transistors may be a transistor 100, e.g., of the type described with reference to FIGS. 2A-3C above.

The top source or drain contact line 102b for each transistor 100 may be in electrical contact with the semiconductor channel 1 of the NAND sting's memory cell portion (directly or via body contact electrode 1102). Alternatively the line 102 at the top of the transistor 100 may be omitted and the source region 110b or channel 110c in the top portion of the pillar may be in direct electrical contact with the semiconductor channel 1 of the NAND sting's memory cell portion.

Gate electrodes 105 for each transistor 100 may be formed below the NAND string 1180, e.g., in the base layer 1100. The gate electrodes 105 may include a gate isolation layer (e.g., layer 103 as shown in FIGS. 2A-3C) electrically insulating the gate electrodes 105 from the source, drain, and channel regions 110a, 110b, and 110c in the semiconductor pillar 101 of the transistor 100. The gate electrodes 105 may comprise or be in electrical contact with a select gate electrode of the NAND string 1180, e.g., conductive rails (not shown) extending in the direction into and out of the page in FIGS. 6A and 7A.

The channel 110c of the transistor extends vertically down through the base layer 1100 to a bottom doped source or drain region 110a. In some embodiments, the base layer 1100 may include a source or drain contact line 102a made of a conductive material (e.g., a metal, metal silicate, or metal nitride) formed below the bottom doped source or drain region 110a. The bottom contact line 102a may be formed in the base 301/1100 (e.g., as shown in FIG. 4J).

As described above, in some embodiments an electrically insulating semiconductor oxide material 106 (as shown in FIGS. 2A-3C) can advantageously reduce or eliminate current leakage between the gate electrodes 105 and the bottom electrically conductive contact line 102a.

As will be apparent to one skilled in the art in view of the present disclosure, in some embodiments, an array of NAND strings 1180 may be formed monolithically above the array of transistors 100 shown in FIG. 4J, with each transistor 100 functioning as a select gate or access transistor for a respective NAND string 1180.

In some embodiments, the semiconductor channel 1 may be a filled feature, as shown in FIGS. 7A-7B. In some other embodiments, the semiconductor channel 1 may be hollow, for example a hollow cylinder filled with an insulating fill material 2, as shown in FIGS. 6A-6B. In these embodiments, and an insulating fill material 2 may be formed to fill the hollow part surrounded by the semiconductor channel 1.

The base layer 1100 can include, e.g., any semiconducting substrate 500 known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The base layer 1100 may include integrated circuits fabricated thereon, such as the select transistors 100 (e.g., as shown in FIGS. 6A and 7A) and/or driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 6A-6B. The control gate electrodes 3 may comprise a portion having a strip shape extending substantially parallel to the major surface 1100a of the base layer 1100. The plurality of control gate electrodes 3 comprise at least a first control gate electrode 3a located in a first device level (e.g., device level A) and a second control gate electrode 3b located in a second device level (e.g., device level B) located over the major surface of the base layer below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 6A-7B. Alternatively, the blocking dielectric 7 may be continuous (not shown).

The monolithic three dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment (s) 9 may be continuous (not shown). That is, the charge storage segments may comprise localized regions in a continuous charge storage layer.

The tunnel dielectric 11 of the monolithic three dimensional NAND string is located between each one of the plurality of the discrete charge storage segments 9 and the semiconductor channel 1. The tunnel dielectric 11 may comprise a plurality of blocking dielectric segments 11 or a continuous layer of dielectric material.

The blocking dielectric 7 and the tunnel dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. Alternatively, a polysilicon floating gate may be used.

In various embodiments, the NAND device may include any of the features described in U.S. Pat. No. 8,187,936 issued on May 29, 2013, U.S. patent application Ser. No. 14/133,979 filed Dec. 19, 2013, and U.S. patent application Ser. No. 14/136,103 filed Dec. 20, 2013, all of which are incorporated herein by reference in their entirety.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A transistor device, comprising:
   a pillar of semiconductor material extending vertically from a bottom portion that is in contact with an electrically conductive contact line, wherein the electrically conductive contact line extends laterally past the pillar in a horizontal direction and contacts a sidewall of an electrically insulating line;
   a gate insulating liner layer on a lateral side of the pillar;
   a gate electrode on the gate insulating liner layer extending along the lateral side of the pillar; and
   a region of electrically insulating semiconductor oxide material filling a space between a bottom portion of the gate electrode and a top portion of the electrically conductive contact line and overlying the electrically conductive contact line and extending below a horizontal plane including a top surface of the electrically insulating line.

2. The device of claim 1, wherein the region of electrically insulating semiconductor oxide material substantially fills a recess above the electrically conductive contact line, and wherein corners of the recess comprise one or both of:
   an unoxidized semiconductor material residue disposed below the region of electrically insulating semiconductor oxide material, and
   an oxidized metal material residue from an oxidized barrier metal layer disposed between the pillar of semiconductor material and the electrically conductive contact line.

3. The device of claim 2, wherein the pillar comprises a channel of the transistor device.

4. The device of claim 3, wherein the electrically conductive contact line comprises one of a source or a drain contact line of the transistor.

5. The device of claim 4, further comprising the other one of a source or a drain contact line of the transistor in electrical contact with a top portion of the pillar.

6. The device of claim 4, wherein the pillar comprises a channel layer of a first conductivity type semiconductor material sandwiched between a source or drain layer of a second conductivity type semiconductor material and a drain or source layer of the second conductivity type semiconductor material.

7. The device of claim 6, wherein the first conductivity type is n-type and the second conductivity type is p-type.

8. The device of claim 6, wherein the first conductivity type is p-type and the second conductivity type is n-type.

9. The device of claim 4, wherein the semiconductor material comprise polycrystalline silicon.

10. The device of claim 4, wherein the region of electrically insulating semiconductor oxide material comprises an oxidized portion of semiconductor material extending horizontally from the bottom portion of the pillar.

11. A device comprising a plurality of transistors, the device comprising:

a base comprising a plurality of electrically conductive contact lines horizontally alternating with a plurality of electrically insulating lines, wherein:
  the plurality of electrically insulating lines insulate each of the plurality of electrically conductive contact lines from the others of the plurality of electrically conductive contact lines,
  each of the plurality of electrically insulating lines comprises an upper layer of a first electrically insulating material overlaying a lower layer of a second electrically insulating material, and
  the base has a top surface comprising respective recesses overlaying, and extending in a first horizontal direction along, each of the plurality of the electrically conductive contact lines;
a first plurality of pillars of semiconductor material, each pillar extending vertically from a bottom portion in contact with a respective one of the plurality of electrically conductive contact lines and further extending vertically along one of the plurality of recesses overlaying a respective one of the plurality of electrically conductive contact lines to a top potion having a top surface within a first horizontal plane located vertically above a second horizontal plane including the top surface of the base, wherein a portion of the respective electrically conductive contact line and the respective overlaying recess extend from a lateral side of the pillar along the first horizontal direction;
one or more gate electrodes extending horizontally along lateral sides of each of the plurality of pillars and electrically insulted from the pillars by a gate insulating liner layer; and
a semiconductor oxide material filling at least portions of the recesses extending laterally from the lateral side of each of the plurality of pillars to form gate bottom insulation regions filing spaces between bottom portions of the one or more gate electrodes and the top portions of the plurality of electrically conductive contact lines, wherein each of the gate bottom insulation regions overlies a respective electrically conductive contact line and extends below the second horizontal plane.

12. The device of claim 11, further comprising a layer of a third insulating material on the top of each of the plurality of pillars.

13. The device of claim 12, wherein:
the plurality of pillars comprises a first line of pillars are arranged along a horizontal line extending along a second horizontal direction transverse to the first horizontal direction; and
further comprising a fourth insulating material filling lateral spaces separating the pillars in the first line of pillars to form a wall structure extending along the second horizontal direction.

14. The device of claim 13, wherein a first one of the one or more gate electrodes extends along a first lateral side of a first pillar of the plurality of pillars, and a second one of the one or more gate electrodes extends along a second lateral side of the first pillar opposite the first lateral side.

15. The device of claim 13, wherein:
the plurality of pillars comprises a second line of pillars are arranged along a horizontal line extending along the first horizontal directions: and
each of the pillars in the second line are in electrical contact with a common one of the plurality of electrically conductive contact lines.

16. The device of claim 11, wherein semiconductor oxide material comprises an oxidized portion of semiconductor material extending horizontally from the bottom portion of the pillar, wherein each of the plurality of pillars comprises a channel, a source, and a drain of a respective transistor.

17. The device of claim 11, wherein each of the plurality of electrically conductive contact lines comprises one of a source contact line or a drain contact line of one or more transistors.

18. The device of claim 17, further comprising a transistor source or drain contact line in electrical contact with a top portion of each of the plurality of pillars.

19. The device of claim 18, wherein each of the plurality of pillars comprises channel layer of a first conductivity type semiconductor material sandwiched between a source or drain layer of a second conductivity type semiconductor material and a drain or source layer of the second conductivity type semiconductor material.

20. The device of claim 13, wherein the first insulating material and the third insulating material comprise silicon nitride and the second insulating material and the fourth insulating material comprise silicon oxide.

21. The device of claim 13, wherein the device comprises a solid state memory device memory device, and each of the transistors comprise a select transistor of the memory device, and the solid state memory device comprises a three dimensional memory device, and the three dimensional memory device comprises a 3D ReRAM device or a vertical NAND device.

22. The device of claim 11, wherein corners of each of the plurality of recesses comprise one or both of:
an unoxidized semiconductor material residue from the region of electrically insulating semiconductor oxide material, and
an oxidized metal material residue from an oxidized barrier metal layer disposed between a respective one of the plurality of pillars and a respective one of the plurality of electrically conductive contact line.

23. The device of claim 1, wherein a bottom surface of the region of electrically insulating semiconductor oxide material is coplanar with a bottom surface of the pillar of semiconductor material.

24. The device of claim 1, wherein a top surface of the region of electrically insulating semiconductor oxide material contacts a bottom surface of the gate insulating liner layer.

25. The device of claim 1, wherein the gate insulating liner layer has a different composition than the electrically insulating semiconductor oxide material.

26. The device of claim 25, wherein the gate insulating liner layer comprises a nitride material, and the region of electrically insulating semiconductor oxide material consists of the electrically insulating semiconductor oxide material.

27. The device of claim 1, wherein the electrically conductive contact line contacts a bottom surface of the region of electrically insulating semiconductor oxide material.

28. The device of claim 1, wherein the electrically conductive contact line and the region of electrically insulating semiconductor oxide material extend along a first horizontal direction, and have a same width along a second horizontal direction that is perpendicular to the first horizontal direction.

29. The device of claim 1, further comprising a barrier metal layer comprising a material that inhibits compound formation between the electrically conductive contact line and the semiconductor material of the pillar and located between the pillar and the region of electrically insulating semiconductor oxide material.

30. The device of claim 29, wherein a sum of a width of the region of electrically insulating semiconductor oxide material and twice a thickness of the barrier metal layer is the same as a width of the electrically conductive contact line.

31. The device of claim 1, wherein the electrically conductive contact line comprises at least one material selected from a metal, a metal nitride, and a metal silicide.

32. The device of claim 1, wherein the electrically conductive contact line comprises a stack of a metal and a metal nitride.

33. The device of claim 1, wherein the region of electrically insulating semiconductor oxide material comprises a semiconductor oxide of a same semiconductor material as the semiconductor material of the pillar.

34. The device of claim 11, wherein each bottom surface of the gate bottom insulation regions is coplanar with bottom surfaces of the first plurality of pillars of semiconductor material.

35. The device of claim 11, wherein a top surface of each gate bottom insulation region contacts a bottom surface of a respective gate insulating liner layer.

36. The device of claim 11, wherein the gate insulating liner layer has a different composition than the gate bottom insulation regions.

37. The device of claim 36, wherein the gate insulating liner layer comprises a nitride material, and the gate bottom insulation regions consist of the semiconductor oxide material.

38. The device of claim 11, wherein each electrically conductive contact line contacts a bottom surface of a respective gate bottom insulation region.

39. The device of claim 11, wherein each electrically conductive contact line has a same width as an overlying gate bottom insulation region.

40. The device of claim 11, further comprising a barrier metal layer comprising a material that inhibits compound formation between the electrically conductive contact lines and the semiconductor material of the first plurality of pillars and located between the first plurality of pillars and the gate bottom insulation regions.

41. The device of claim 40, wherein a sum of a width of each gate bottom insulation region and twice a thickness of the barrier metal layer is the same as a width of an underlying electrically conductive contact line.

42. The device of claim 11, wherein the electrically conductive contact lines comprise at least one material selected from a metal, a metal nitride, and a metal silicide.

43. The device of claim 11, wherein the electrically conductive contact lines comprise a stack of a metal and a metal nitride.

44. The device of claim 11, wherein the gate bottom insulation regions comprise a semiconductor oxide of a same semiconductor material as the semiconductor material of the first plurality of pillars.

45. The device of claim 1, wherein each of a bottom portion of the pillar of semiconductor material and the region of electrically insulating semiconductor oxide material includes dopant atoms of a same species and of a same conductivity type that is either p-type or n-type.

46. The device of claim 11, wherein each of a bottom portion of the first plurality of pillars and the gate bottom insulation regions includes dopant atoms of a same species and of a same conductivity type that is either p-type or n-type.

47. The device of claim 1, wherein the electrically insulating line comprises a vertical stack of a lower layer and an upper layer, and the region of electrically insulating semiconductor oxide material extends above a horizontal plane including an interface between the lower layer and the upper layer.

48. The device of claim 11, wherein each of the electrically insulating line comprises a vertical stack of a lower layer and an upper layer, and the gate bottom insulation regions extend above a horizontal plane including an interface between the lower layer and the upper layer.

\* \* \* \* \*